(12) United States Patent
Min et al.

(10) Patent No.: US 11,199,930 B2
(45) Date of Patent: Dec. 14, 2021

(54) TOUCH DISPLAY DEVICE AND METHOD FOR MANUFACTURING TOUCH DISPLAY DEVICE

(71) Applicant: LG DISPLAY CO., LTD., Seoul (KR)

(72) Inventors: HyunJun Min, Gyeonggi-do (KR); YongMin Ha, Seoul (KR); SeungRok Shin, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 126 days.

(21) Appl. No.: 16/222,680

(22) Filed: Dec. 17, 2018

(65) Prior Publication Data
US 2019/0204953 A1 Jul. 4, 2019

(30) Foreign Application Priority Data
Dec. 28, 2017 (KR) .................. 10-2017-0182190

(51) Int. Cl.
*G06F 3/044* (2006.01)
*H01L 27/32* (2006.01)
*G06F 3/041* (2006.01)

(52) U.S. Cl.
CPC .......... *G06F 3/044* (2013.01); *G06F 3/0445* (2019.05); *G06F 3/0446* (2019.05); *G06F 3/04164* (2019.05); *H01L 27/323* (2013.01); *G06F 3/0412* (2013.01); *G06F 3/0416* (2013.01); *G06F 3/0443* (2019.05); *G06F 2203/04103* (2013.01); *G06F 2203/04112* (2013.01)

(58) Field of Classification Search
CPC ...... G06F 3/044; G06F 3/0443; G06F 3/0412; G06F 3/0416; G06F 3/0445; G06F 3/0446; G06F 3/04164; G06F 2203/04103; G06F 2203/04112
See application file for complete search history.

(56) References Cited

U.S. PATENT DOCUMENTS

| | | | |
|---|---|---|---|
| 2011/0074729 A1* | 3/2011 | Im | G02F 1/1339 345/174 |
| 2013/0207922 A1* | 8/2013 | Gillmore | G06F 3/0445 345/174 |
| 2015/0060817 A1 | 3/2015 | Sato et al. | |
| 2015/0206501 A1 | 7/2015 | Kurasawa et al. | |
| 2016/0342243 A1* | 11/2016 | Kung | G09G 5/00 |
| 2016/0343984 A1 | 11/2016 | Zeng et al. | |
| 2016/0372523 A1 | 12/2016 | Ito et al. | |
| 2018/0136766 A1* | 5/2018 | Kim | G06F 3/0412 |
| 2018/0166507 A1* | 6/2018 | Hwang | G06F 3/0416 |

FOREIGN PATENT DOCUMENTS

WO  WO 2016/204525 A1  12/2016

* cited by examiner

*Primary Examiner* — William Boddie
*Assistant Examiner* — Jeffrey Parker
(74) *Attorney, Agent, or Firm* — Birch, Stewart, Kolasch & Birch, LLP

(57) ABSTRACT

Discussed is a display device including a first substrate; a display panel including first and second electrodes disposed on the first substrate, and a light-emitting layer located between the first electrode and the second electrode; an encapsulation layer disposed on the second electrode of the display panel; a first touch electrode unit disposed on the encapsulation layer and extending in one of a first direction and a second direction intersecting with the first direction; and a first passivation layer disposed on the first touch electrode unit.

19 Claims, 26 Drawing Sheets

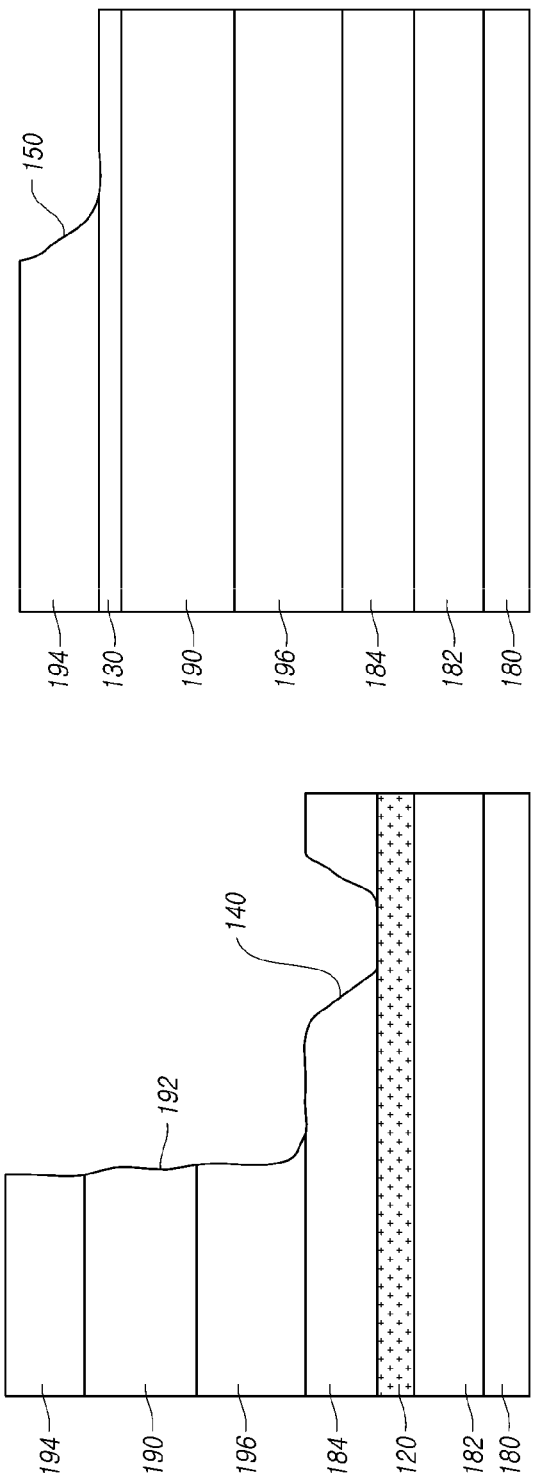

TOUCH DISPLAY DEVICE AND METHOD FOR MANUFACTURING TOUCH DISPLAY DEVICE

CROSS REFERENCE TO RELATED APPLICATION

This application claims priority from Korean Patent Application No. 10-2017-0182190, filed on Dec. 28, 2017 in the Korean Intellectual Property Office, which is hereby incorporated by reference in its entirety for all purposes as if fully set forth herein.

BACKGROUND OF THE INVENTION

1. Field of the Invention

Embodiments disclosed herein relate to a touch display device and a method of manufacturing a touch display device that display images and provide a touch-based input system.

2. Description of the Related Art

As society developed into an information-based society, demand for display devices for displaying images is increasing in various forms. In recent years, various display devices such as a liquid crystal display device, a plasma display device, and an organic light-emitting display device, have been utilized.

Such display devices include a touch display device capable of providing a touch-based input system that enables a user to easily input information or a command intuitively and conveniently, avoiding conventional input systems, such as a button, a keyboard, and a mouse.

In order to provide such a touch-based input system, it is necessary to determine presence or absence of a user's touch, and to correctly detect touch coordinates. To this end, a capacitance-based touch sensing system for detecting presence or absence of a touch, touch coordinates, or the like based on a change in capacitance formed on a plurality of touch electrodes is widely used among various types of touch sensing systems.

In such a touch display device, since a display panel includes various kinds of electrodes and wirings, a parasitic capacitance increases when a distance between the display panel and the touch electrodes is reduced, which results in deterioration of touch performance. This deterioration of touch performance has been a limiting factor in maximizing a display panel.

SUMMARY OF THE INVENTION

In view of the foregoing, an aspect of the embodiments disclosed herein is to provide a touch display device, a method of manufacturing the touch display device, and a film of the display device, in which touch performance is improved by reducing a parasitic capacitance by sufficiently reducing a distance between a display panel and a touch electrode.

Another aspect of the embodiments disclosed herein is to provide a touch display device, a method of manufacturing the same, and a film thereof in which touch performance is maintained even in a large-area touch panel.

In one aspect, embodiments disclosed herein provide a display device including: a first substrate; a display panel including first and second electrodes disposed on the first substrate, and a light-emitting layer located between the first electrode and the second electrode; an encapsulation layer disposed on the second electrode of the display panel; a first touch electrode unit disposed on the encapsulation layer and extending in one of a first direction and a second direction intersecting with the first direction; and a first passivation layer disposed on the first touch electrode unit.

The display device can include a second substrate disposed on the first passivation layer, and a second touch electrode unit disposed on the second substrate and extending in a remaining one of the first direction and the second direction.

In another aspect, embodiments disclosed herein provide a film including: a second substrate bonded by an adhesive layer to a first substrate having a display panel, an encapsulation layer disposed on the display panel, and a first touch electrode unit disposed on the encapsulation layer and extending in one of a first direction and a second direction intersecting with the first direction; a second touch electrode unit disposed on the second substrate and extending in a remaining one of the first direction and the second direction; a second touch pad unit disposed on the second substrate and located on the same side surface as the first touch pad unit in the first substrate in one of the first direction and the second direction and connected to the touch driving circuit; and a second touch line unit disposed on the second substrate, electrically connected to the second touch electrode unit, and connected to the touch driving circuit through the second touch pad unit.

In still another aspect, embodiments disclosed herein provide a method of manufacturing a touch display device including: forming a display panel including first and second electrodes disposed on a first substrate and a light-emitting layer located between the first electrode and the second electrode; forming an encapsulation layer on the second electrode of the display panel; forming a first touch electrode unit extending in one of a first direction and a second direction intersecting with the first direction on the encapsulation layer; forming a first passivation layer on the first touch electrode unit; forming a second touch electrode unit extending on the second substrate in a remaining one of the first direction and the second direction; and bonding the first passivation layer and the second substrate to each other by an adhesive layer.

According to the embodiments described above, it is possible to provide a touch display device, a method of manufacturing the touch display device, and a film of the touch display device in which touch performance can be improved by reducing a parasitic capacitance by sufficiently reducing a distance between a display panel and a touch electrode.

According to the embodiments, provided are a touch display device, a method of manufacturing the touch display device, and a film of the display device in which touch performance can be maintained even in a large-area touch panel.

BRIEF DESCRIPTION OF THE DRAWINGS

The above and other aspects, features and advantages of the present disclosure will be more apparent from the following detailed description taken in conjunction with the accompanying drawings, in which:

FIG. 8C is a diagram illustrating a positional relationship between the first touch pads and a positional relationship between second touch pads in a side-by-side comparison;

DETAILED DESCRIPTION OF THE EMBODIMENTS

Figure 1:
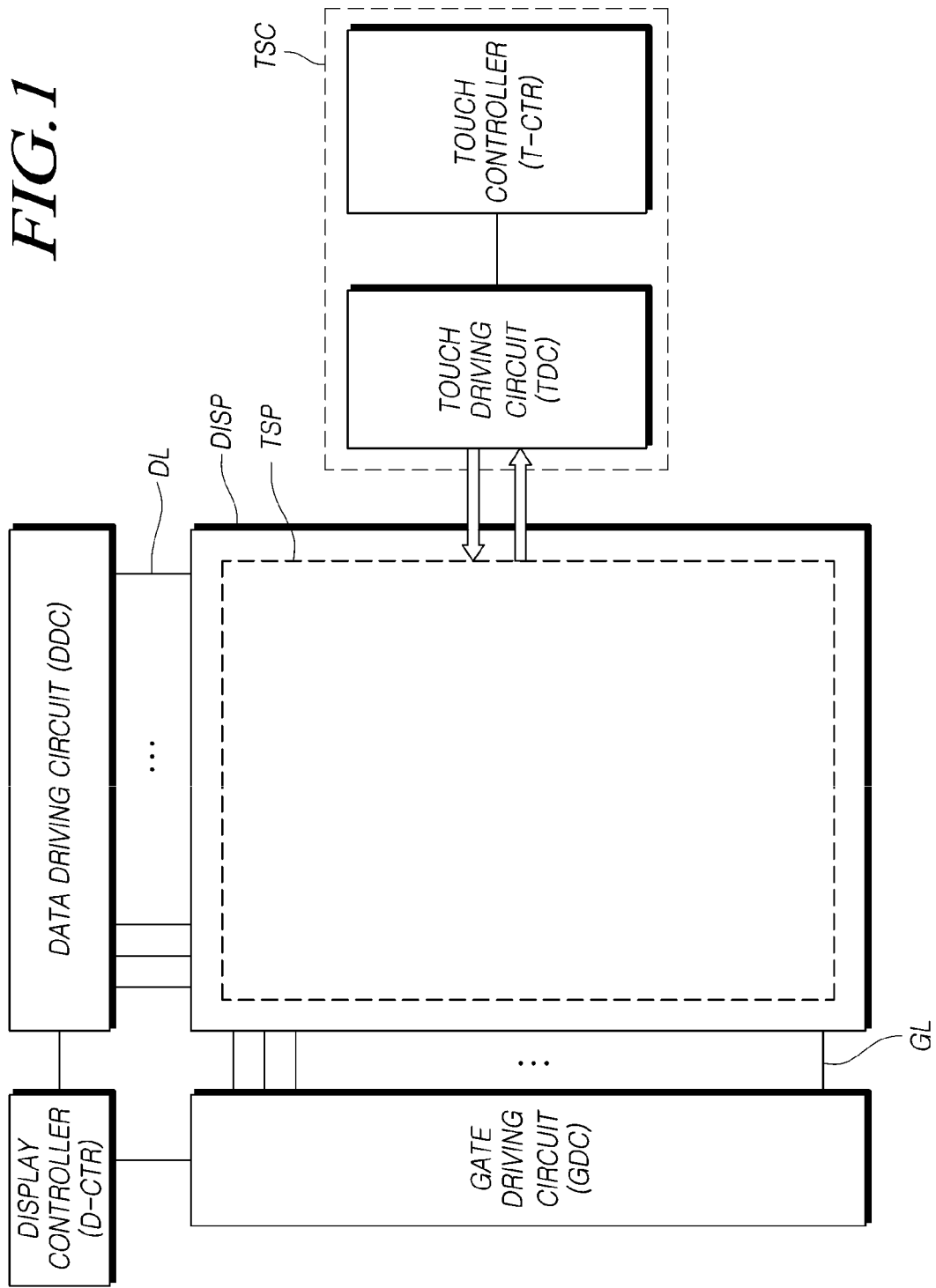
FIG. 1 is a system configuration diagram of a touch display device to which embodiments of the present disclosure are applied.

Hereinafter, some embodiments of the present disclosure will be described in detail with reference to the accompanying illustrative drawings. In designating elements of the drawings by reference numerals, the same elements will be designated by the same reference numerals although they are shown in different drawings. Further, in the following description of the present disclosure, a detailed description of known functions and configurations incorporated herein will be omitted when it may obscure the subject matter of the present disclosure.

In addition, terms, such as first, second, A, B, (a), (b) or the like may be used herein when describing components of the present disclosure. Each of these terminologies is not used to define an essence, order or sequence of a corresponding component but used merely to distinguish the corresponding component from other component(s). In the instance that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element.

When an element or layer is referred to as being "above" or "on" another element, it can be "directly above" or "directly on" the other element or layer or intervening elements or layers may be present. In contrast, when an element is referred to as being "directly on" or "directly above" another element or layer, there are no intervening elements or layers present.

Spatially relative terms, such as "below", "beneath", "lower", "above", "upper" and the like, may be used herein for ease of description to describe one element or feature's relationship to another element(s) or feature(s) as illustrated in the figures. It will be understood that the spatially relative terms are intended to encompass different orientations of the element in use or operation in addition to the orientation depicted in the figures. For example, if the element in the figures is turned over, elements described as "below" or "beneath" other elements would then be oriented "above" the other elements. Thus, the exemplary term "below" can encompass both an orientation of above and below.

In addition, terms, such as first, second, A, B, (a), (b) or the like may be used herein when describing components of the present disclosure. Each of these terminologies is not used to define an essence, order or sequence of a corresponding component but used merely to distinguish the corresponding component from other component(s).

FIG. 1 is a system configuration diagram of a touch display device to which embodiments of the present disclosure are applied.

Referring to FIG. 1, a touch display device to which the embodiments of the present disclosure are applied can provide an image display function for displaying images and a touch sensing function for sensing a user's touch. All the components of the touch display device according to all embodiments of the present disclosure are operatively coupled and configured.

The touch display device to which the present embodiments are applied can include a display panel DISP in which data lines DL and gate lines GL are arranged, a display driving circuit for driving the display panel DISP, and the like, for image display.

The display driving circuit can include a data driving circuit DDC configured to drive data lines, a gate driving circuit GDC configured to drive gate lines, a data driving circuit DDC, a display controller D-CTR configured to control the gate driving circuit, and the like.

The touch display device to which the present embodiments are applied can include a touch panel TSP in which a plurality of touch electrodes TE are disposed as touch sensors for touch sensing, and a touch sensing circuit TSC configured to perform driving and sensing processing of the touch panel TSP, and the like.

The touch sensing circuit TSC supplies a driving signal to the touch panel TSP in order to drive the touch panel TSP, detects a sensing signal from the touch panel TSP, and senses presence or absence of a touch and/or a touch position (touch coordinates).

Such a touch sensing circuit TSC can include a touch driving circuit TDC configured to supply a driving signal and to receive a sensing signal, a touch controller T-CTR configured to calculate presence or absence of a touch and/or a touch position (touch coordinates), etc.

The touch sensing circuit TSC can be implemented with one or more components (e.g., integrated circuits), and can be implemented separately from the display driving circuit.

In addition, the entirety or a part of the touch sensing circuit TSC can be integrated with the display driving circuit and one or more of the internal circuits of the display driving circuit. For example, the touch driving circuit TDC of the touch sensing circuit TSC can be implemented as an integrated circuit together with the data driving circuit DDC of the display driving circuit.

Meanwhile, the touch display device to which the present embodiments are applied is able to sense a touch based on a capacitance formed on the touch electrodes TE.

The touch display device to which the present embodiments are applied is able to sense a touch with a capacitance-based touch sensing system, more particularly, with a self-capacitance-based touch sensing system or a mutual-capacitance-based touch sensing system. Hereinafter, the touch display device to which the embodiments of the present disclosure are applied is described as sensing a touch with a mutual-capacitance-based touch sensing system, but the embodiments are not limited thereto.

In order to transmit driving signals and sensing signals, each of the plurality of touch electrodes TE can be electrically connected to the touch driving circuit TDC through one or more touch lines TL.

Meanwhile, the display panel DISP of the touch display device to which the present embodiments are applied can be any of various types of displays such as an organic light-emitting diode panel (OLED panel), a liquid crystal display panel (LCD Panel), and the like. Hereinafter, for convenience of explanation, an organic light-emitting diode (OLED) panel will be mainly described as an example.

Figure 2A:
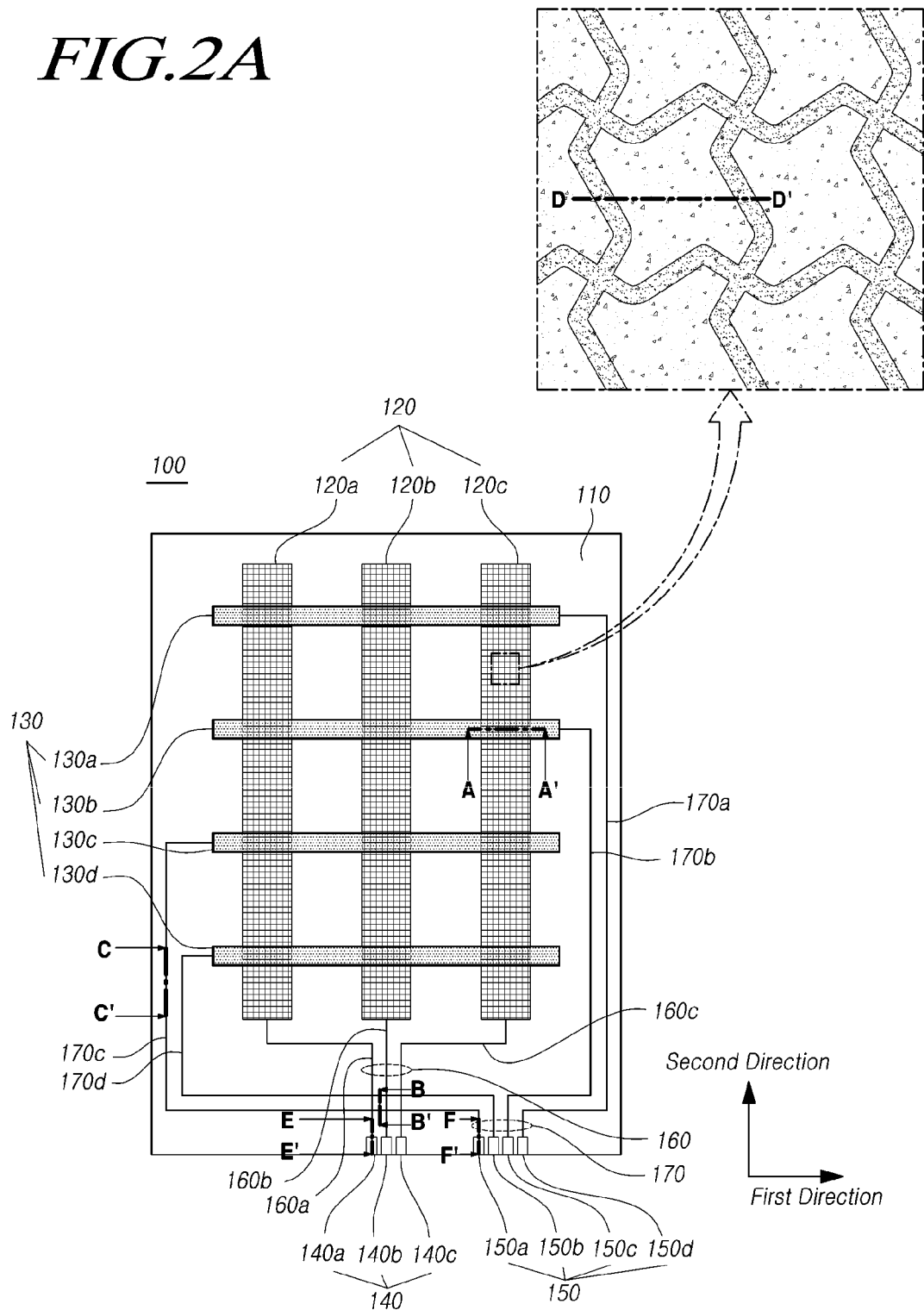
FIGS. 2A and 2B are plan views each illustrating a touch display device according to an embodiment.
Figure 2B:
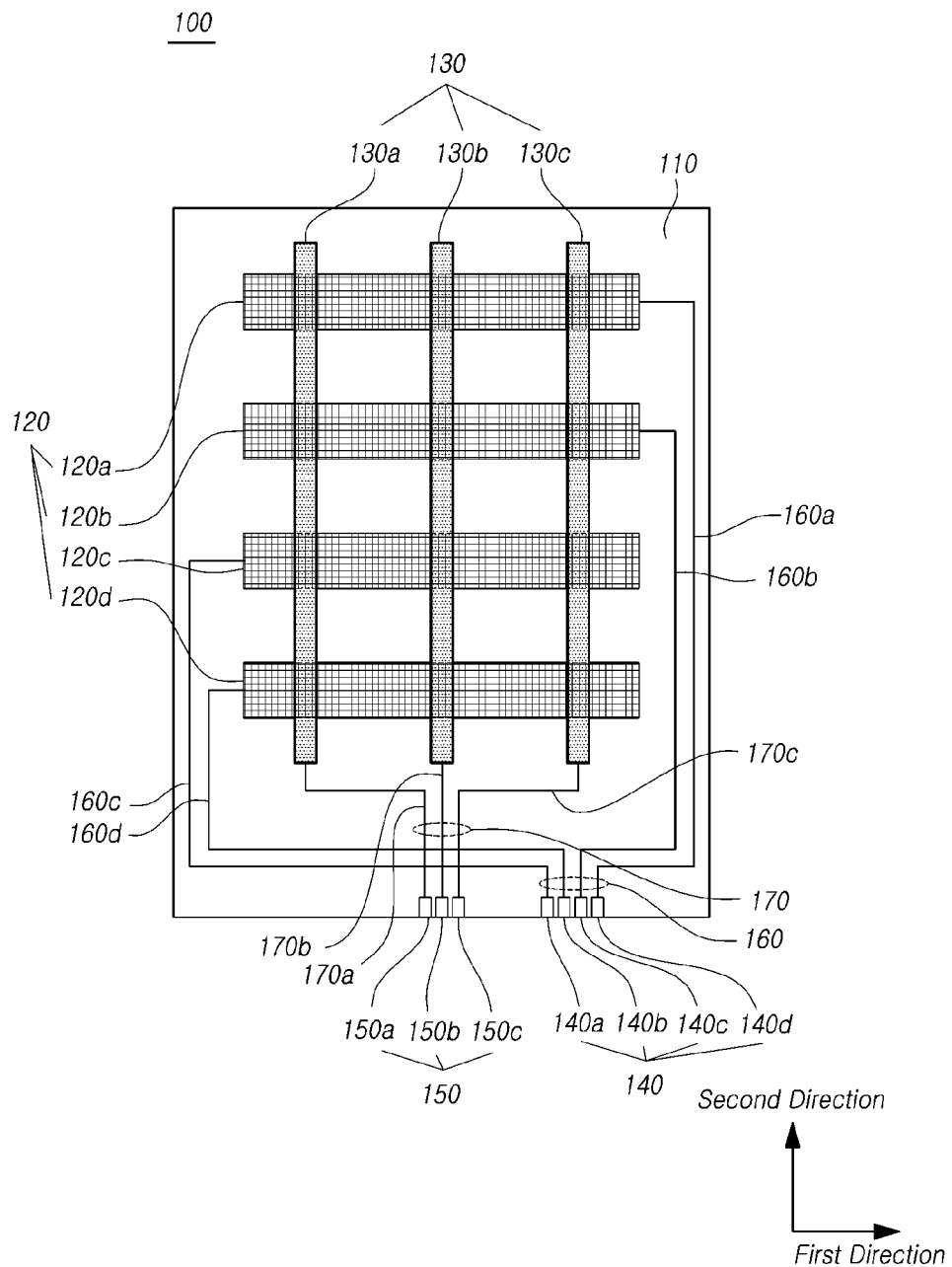

FIGS. 2A and 2B are plan views each illustrating a touch display device according to an embodiment.

Referring to FIGS. 2A and 2B, the touch display device 100 according to one embodiment includes a first touch electrode unit 120, to which a touch driving signal can be applied, on a display panel 110, and a second touch electrode unit 130, which forms a capacitance with the first touch electrode unit 120 and from which a touch sensing signal is sensed. That is, the first touch electrode unit 120 can be a touch driving electrode and the second touch electrode unit 130 can be a touch sensing electrode. In contrast, the second touch electrode unit 130 can be a touch driving electrode configured to apply a touch driving signal, and the first touch electrode unit 120 can be a touch sensing electrode configured to sense a touch sensing signal.

The display panel 110 includes two or more pixels disposed at the regions where two or more data lines and two or more gate lines intersect with each other.

The touch display device 100 can detect presence or absence of a touch and/or touch coordinates based on a change in capacitance (mutual-capacitance) between the first touch electrode unit 120 and the second touch electrode unit 130 depending on presence or absence of a pointer such as a finger or a pen.

The first touch electrode unit 120 extends in one of a first direction and a second direction intersecting with the first direction, and the second touch electrode unit 130 extends in the other one of the first direction and the second direction. The first direction can be the same direction as the data lines, or can be the same direction as the gate lines.

In an example, as illustrated in FIG. 2A, the first touch electrode unit 120 can extend in the second direction, and the second touch electrode unit 130 can extend in the first direction. In another example, as illustrated in FIG. 2B, the first touch electrode unit 120 can extend in the first direction, and the second touch electrode unit 130 can extend in the second direction.

Referring to FIGS. 2A and 2B, the touch display device 100 according to an embodiment includes: a first touch pad unit 140 connected to the touch driving circuit TDC illustrated in FIG. 1; a second touch pad unit 150 connected to the touch driving circuit TDC; a first touch line unit 160 electrically connected to the first touch electrode unit 120 and connected to the touch driving circuit TDC through the first touch pad unit 140; and a second touch line unit 170 electrically connected to the second touch electrode unit 130 and connected to the touch driving circuit TDC through the second touch pad unit 150.

The first touch pad unit 140 and the second touch pad unit 150 can be located on the same side as one of the first direction and the second direction and can be connected to the touch driving circuit TDC.

The first touch line unit 160 and the first touch electrode unit 120 can be formed on different layers or on the same layer.

The second touch line unit 170 and the second touch electrode unit 130 can be formed on different layers or on the same layer.

Figure 3A:
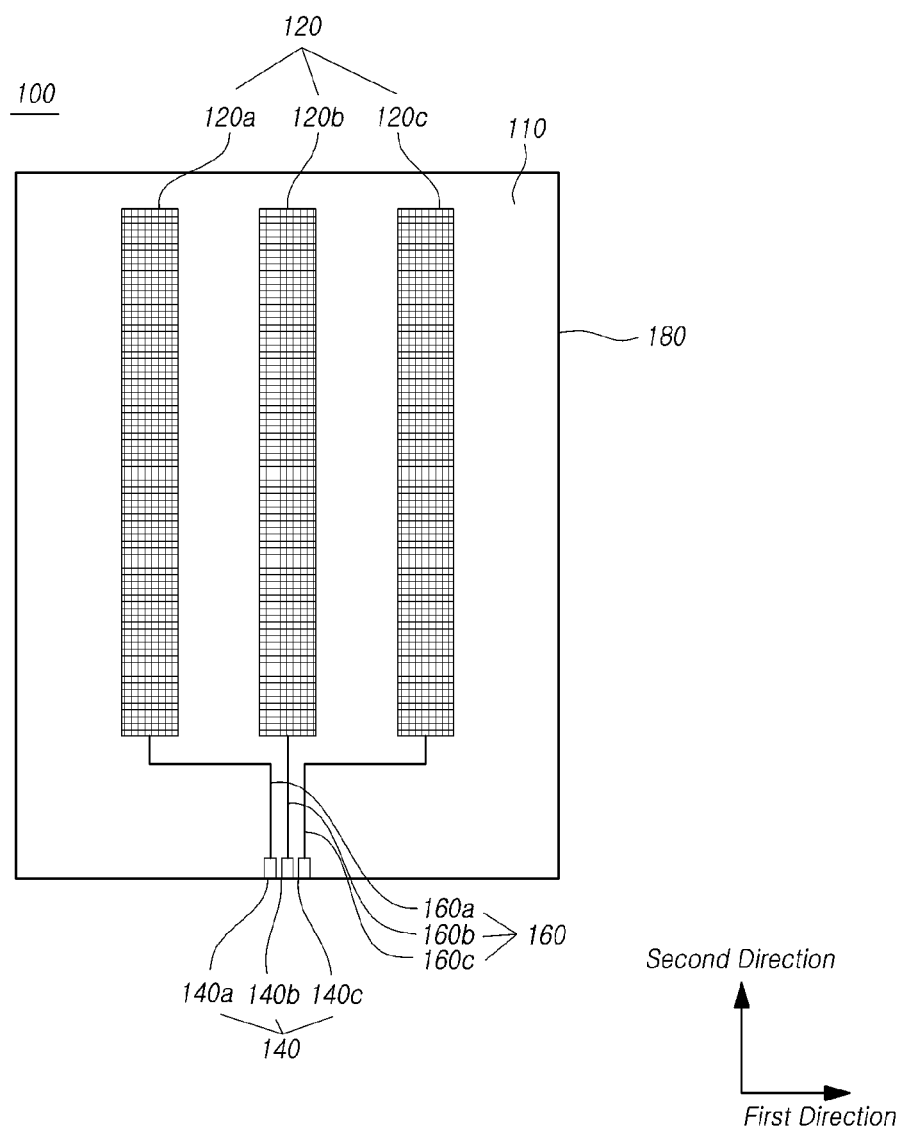
FIGS. 3A and 3B are plan views separately illustrating a first substrate and a second substrate of the touch display device of FIG. 2A.
Figure 3B:
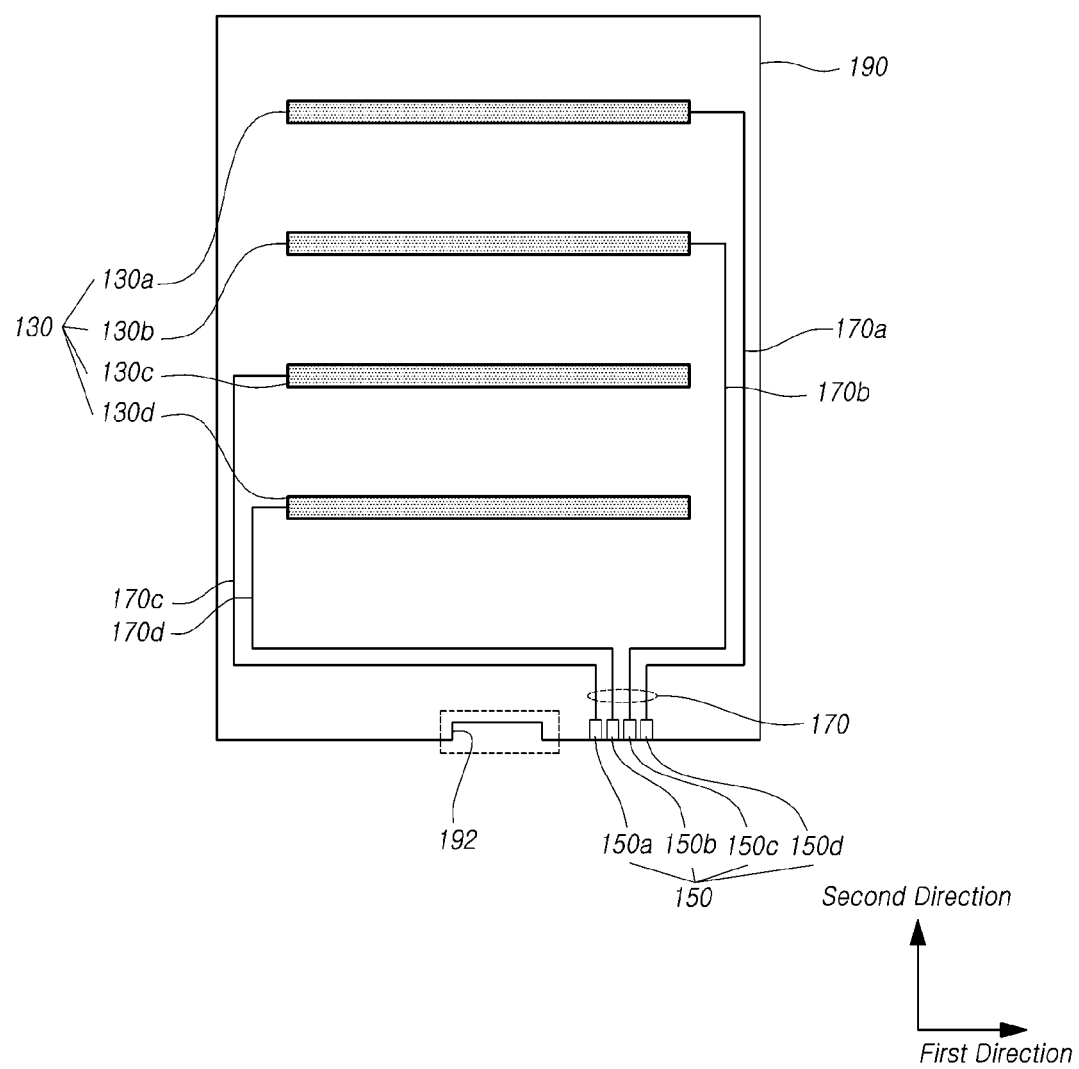

FIGS. 3A and 3B are plan views separately illustrating a first substrate and a second substrate of the touch display device of FIG. 2A.

Referring to FIGS. 2A, 3A, and 3B, the first touch electrode unit 120, the first touch pad unit 140, and the first touch line unit 160 can be disposed on a first substrate 180 having a display panel 110 disposed thereon, and the second touch electrode unit 130, the second touch pad unit 150, and the second touch line unit 170 can be disposed on a second substrate 190.

As illustrated in FIG. 3A, the display panel 110, the first touch electrode unit 120, the first touch pad unit 140, and the first touch line unit 160 can be disposed on the first substrate 180. As illustrated in FIG. 3B, the second touch electrode unit 130, the second touch pad unit 150, and the second touch line unit 170 can be disposed on the second substrate 190. The second substrate 190 can be disposed on the first substrate 180.

Accordingly, the second touch electrode unit 130, the second touch pad unit 150, and the second touch line unit 170 can be located to be higher than the first touch electrode unit 120, the first touch pad unit 140, and the first touch line unit 160 with reference to the display panel 110.

The first touch electrode unit 120 includes two or more first touch electrodes, for example, three first touch electrodes 120a, 120b, and 120c, and the second touch electrode unit 130 includes two or more second touch electrodes, for example, four second touch electrodes 130a, 130b, 130c, and 130d.

The first touch line unit 160 includes two or more first touch lines, for example, three first touch lines 160a, 160b, and 160c, which can be connected to the first touch electrodes 120a, 120b, and 120c, respectively, and the second touch line unit 170 includes two or more second touch electrodes, for example, four second touch lines 170a, 170b, 170c, and 170d, which can be connected to the second touch electrodes 130a, 130b, 130c, and 130d, respectively.

The first touch pad unit 140 includes two or more first touch pads, for example, three first touch pads 140a, 140b, and 140c, which can be connected to two or more first touch lines 160a, 160b, and 160c, respectively, and the second touch pad unit 150 includes two or more second touch pads, for example, four second touch pads 150a, 150b, 150c, and 150*d*, which can be connected to two or more second touch lines 170*a*, 170*b*, 170*c*, and 170*d*, respectively.

Some of the second touch lines 170*a*, 170*b*, 170*c*, and 170*d* (e.g., the second touch lines 170*c* and 170*d*) can be connected to some of the second touch pads 150*a*, 150*b*, 150*c*, and 150*d* (e.g., the second touch pads 150*a* and 150*b*) through one of the opposite side faces of the first substrate 180 in the first direction, for example, the left side face in FIG. 2A, and the remaining ones of the second touch lines 170*a*, 170*b*, 170*c*, and 170*d* (e.g., the second touch lines 170*a* and 170*b*) can be connected to the remaining ones of the second touch pads 150*a*, 150*b*, 150*c*, and 150*d* (e.g., the second touch pads 150*d* and 150*c*) through the other one of the opposite side faces of the first substrate 180 in the first direction, for example, the right side face in FIG. 2A.

Each of the first touch electrodes 120*a*, 120*b*, and 120*c* can be made of a metal or an alloy thereof in the form of a mesh, as illustrated in FIG. 2A, each of the first touch lines 160*a*, 160*b*, and 160*c* can contain the same material as the first touch electrodes 120*a*, 120*b*, and 120*c*, the second touch electrodes 130*a*, 130*b*, 130*c*, and 130*d* can be made of an integrated transparent metal oxide 130', and the second touch lines 170*a*, 170*b*, 170*c* and 170*d* can be formed of the same material 130' as the second touch electrodes 130*a*, 130*b*, 130*c*, and 130*d* and a metal or an alloy thereof 130" in at least two layers.

The first touch pads 140*a*, 140*b*, and 140*c* and the second touch pads 150*a*, 150*b*, 150*c*, and 150*d* can be gathered or grouped together.

The second substrate 190 can have a first touch pad unit groove 192 disposed at a position corresponding to the first touch pad unit 140. The first touch pad unit 140 disposed on the first substrate 180 through the first touch pad unit groove 192 can be connected to the touch driving circuit TDC exposed to the second substrate 190.

The first touch electrode unit 120 includes two or more first touch electrodes and the second touch electrode unit 130 includes two or more second touch electrodes.

The first touch line unit 160 includes two or more first touch lines, which can be connected to two or more first touch electrodes, respectively, and the second touch line unit 170 includes two or more second touch lines, which can be connected to two or more second touch electrodes, respectively.

Figure 4A:
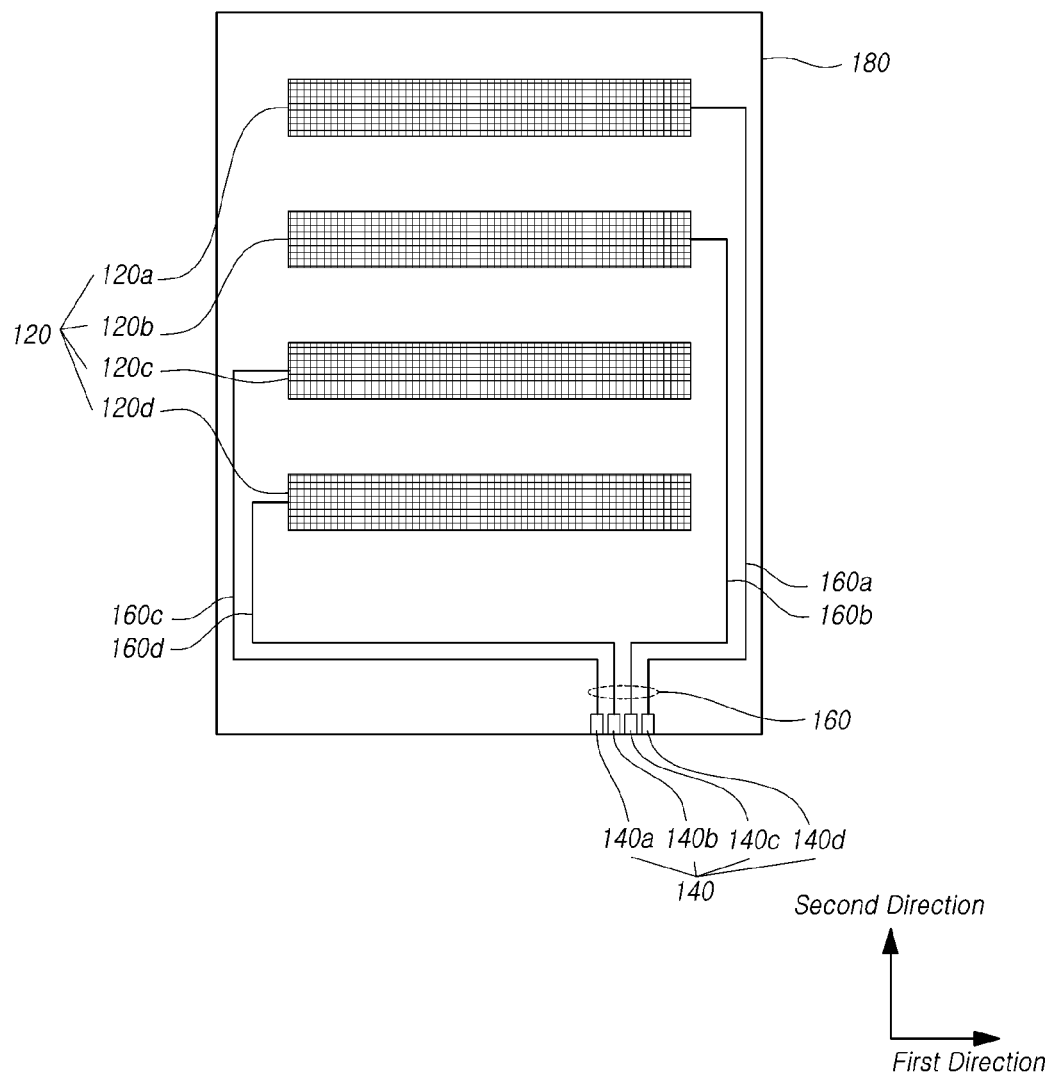
FIGS. 4A and 4B are plan views separately illustrating a first substrate and a second substrate of the touch display device of FIG. 2B.
Figure 4B:
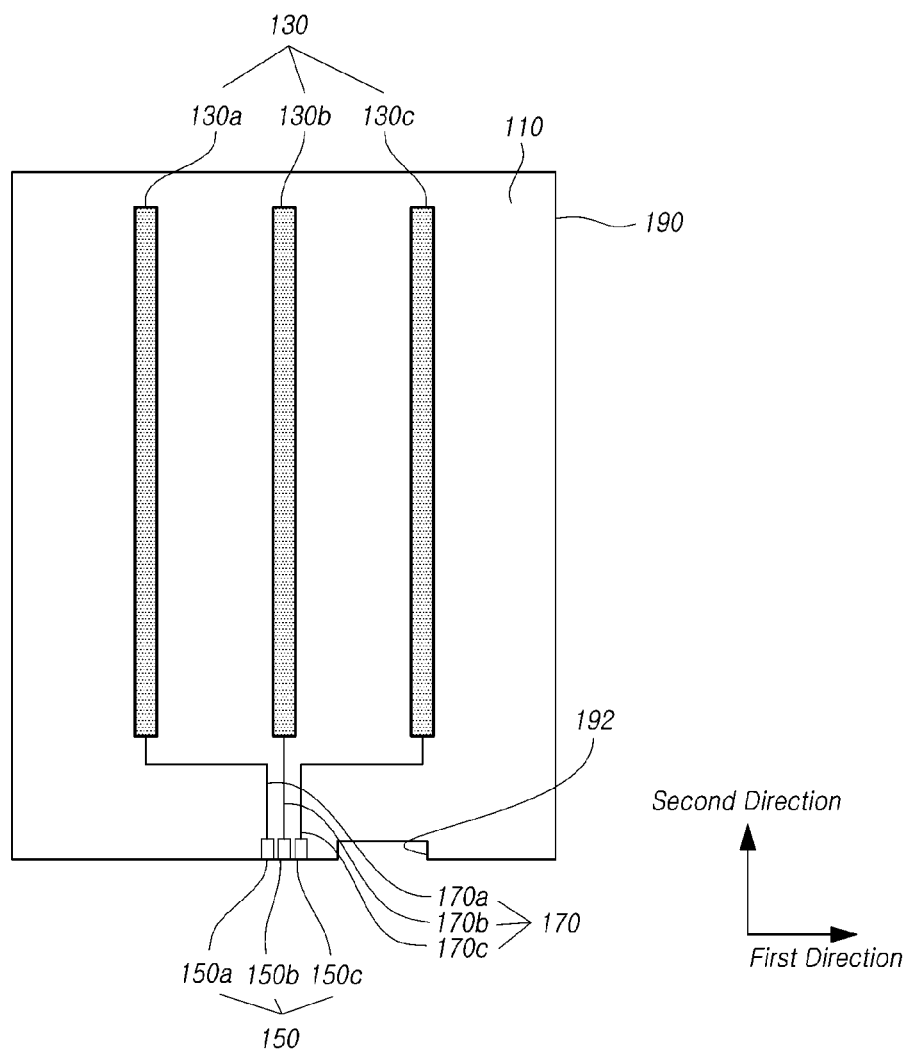

FIGS. 4A and 4B are plan views separately illustrating a first substrate and a second substrate of the touch display device of FIG. 2B.

Referring to FIGS. 2B, 4A, and 4B, the first touch electrode unit 120 can extend in the first direction, and the second touch electrode unit 130 can extend in the second direction.

The first touch electrode unit 120 includes two or more first touch electrodes, for example, four first touch electrodes 120*a*, 120*b*, 120*c*, and 120*d*, and the second touch electrode unit 130 includes two or more touch electrodes, for example, three second touch electrodes 130*a*, 130*b*, and 130*c*. When the length of the first substrate 180 in the second direction is longer than the length in the first direction, the number of the first touch electrodes 120*a*, 120*b*, 120*c*, and 120*d* arranged in the second direction can be greater than the number of the second touch electrodes 130*a*, 130*b*, and 130*c*. However, the numbers of the first touch electrodes 120*a*, 120*b*, 120*c*, and 120*d* can be the same as or smaller than the number of the second touch electrodes 130*a*, 130*b*, and 130*c*.

Similarly, the first touch line unit 160 includes two or more first touch lines, for example, four first touch lines 160*a*, 160*b*, 160*c*, and 160*d*, which can be connected to the first touch electrodes 120*a*, 120*b*, 120*c*, and 120*d*, respectively, and the second touch line unit 170 includes two or more second touch lines, for example, three second touch lines 170*a*, 170*b*, and 170*c*, which can be connected to the second touch electrodes 130*a*, 130*b*, and 130*c*, respectively.

Similarly, the first touch pad unit 140 includes two or more first touch pads, for example, four first touch pads 140*a*, 140*b*, 140*c*, and 140*d*, which can be connected to two or more first touch lines 160*a*, 160*b*, 160*c*, and 160*d*, respectively, and the second touch pad unit 150 includes two or more second touch pads, for example, three second touch pads 150*a*, 150*b*, and 150*c*, which can be connected to two or more second touch lines 170*a*, 170*b*, 170*c*, and 170*d*, respectively.

As illustrated in FIG. 2B, some of the first touch lines 160*a*, 160*b*, 160*c*, and 160*d* (e.g., the first touch lines 160*c* and 160*d*) can be connected to some of the first touch pads 140*a*, 140*b*, 140*c*, and 140*d* (e.g., the first touch pads 140*a* and 140*b*) through one of the opposite side faces of the first substrate 180 in the first direction, for example, the left side face in FIG. 2B, and the remaining ones of the first touch lines 160*a*, 160*b*, 160*c*, and 160*d* (e.g., the first touch lines 160*a* and 160*b*) can be connected to the remaining ones of the first touch pads 140*a*, 140*b*, 140*c*, and 140*d* (e.g., the first touch pads 140*d* and 140*c*) through the other one of the opposite side faces of the first substrate 180 in the first direction, for example, the right side face in FIG. 2B.

Figure 5:
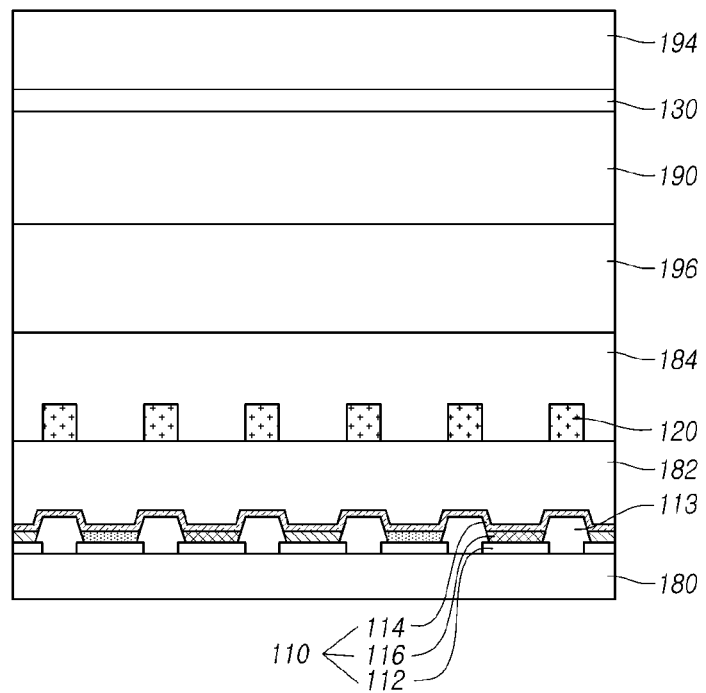
FIG. 5 is a cross-sectional view taken along line A-A' in FIG. 2A.

FIG. 5 is a cross-sectional view taken along line A-A' in FIG. 2A.

The touch display device 100 according to one embodiment includes a first substrate 180, a display panel 110 disposed on the first substrate 180, an encapsulation layer 182 disposed on the display panel 110, a first touch electrode unit 120 disposed on the encapsulation layer 182, and a first passivation layer 184 disposed on the first touch electrode unit 120.

The touch display device 100 according to an embodiment includes a second substrate 190 disposed on the first passivation layer 184 and a second touch electrode unit 130 disposed on the second substrate 190. A second passivation layer 194 can be disposed on the second touch electrode unit 130.

The touch display device 100 according to one embodiment of the present disclosure can additionally include a second passivation layer 194 on the second touch electrode unit 130 and an adhesive layer 196 located between the first passivation layer 184 and the second substrate 190. The first passivation layer 184 and the second substrate 190 can be bonded to each other by the adhesive layer 196.

The first substrate 180 can be a plastic substrate made of various polymeric materials such as polyimide, polyethylene terephthalate, polyethylene naphthalate (PEN), polycarbonate, polyester sulfone, and the like. The second substrate 190 can be a film.

The display panel 110 includes a first electrode 112 disposed on the first substrate 180, a second electrode 114, and a light-emitting layer 116 located between the first electrode 112 and the second electrode 114.

The first electrode 112 can be disposed to correspond to the light-emitting position of each sub-pixel. A bank 113 can be located on the first electrode, and a light-emitting layer 116 can be located on the bank 113. A second electrode 114, which can be formed in common to all the sub-pixel regions, can be disposed on the light-emitting layer 116. When the light-emitting layer 116 emits only one color, a plurality of color filters CF and a black matrix BM can be disposed on the second substrate 190 or between the second substrate 190 and the encapsulation layer 182.

The encapsulation layer 182 can be disposed on the second electrode 114 for preventing penetration of moisture, air, and the like. The encapsulation layer 182 can be a single layer, or two or more layers can be laminated therein. In addition, the encapsulation layer 182 can be a metal layer, or at least one organic layer and at least one inorganic layer can be alternately laminated therein.

The encapsulation layer 182 can be formed to have a predetermined thickness. Here, the thickness of the encapsulation layer 182 can be designed in consideration of RC delay and influence on touch performance (touch sensitivity) at the time of touch driving and touch sensing.

The first touch electrode unit 120 can be located on the encapsulation layer 182 in the display panel 110. By forming the first touch electrode unit 120 on the encapsulation layer 182, the performance of the display panel 110 and the formation of the layers for the display panel 110 may not be greatly affected.

Figure 6A:
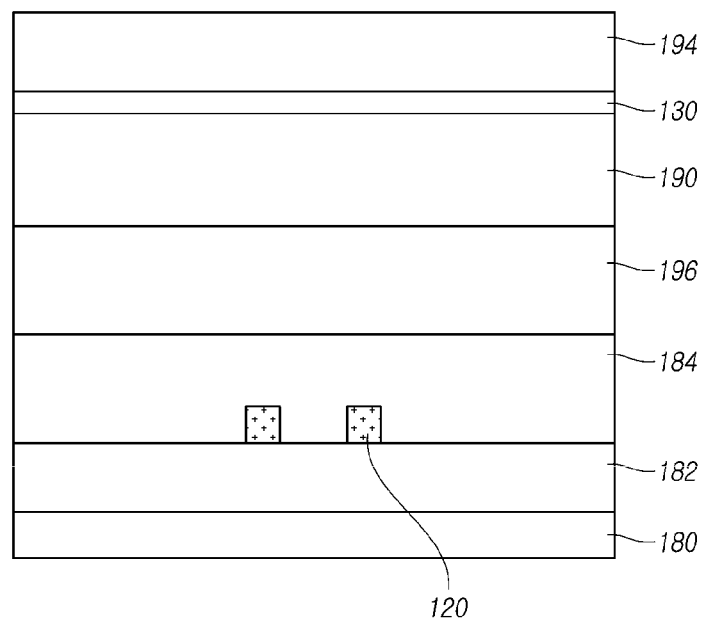
FIG. 6A is a cross-sectional view taken along line B-B' in FIG. 2B.
Figure 6B:
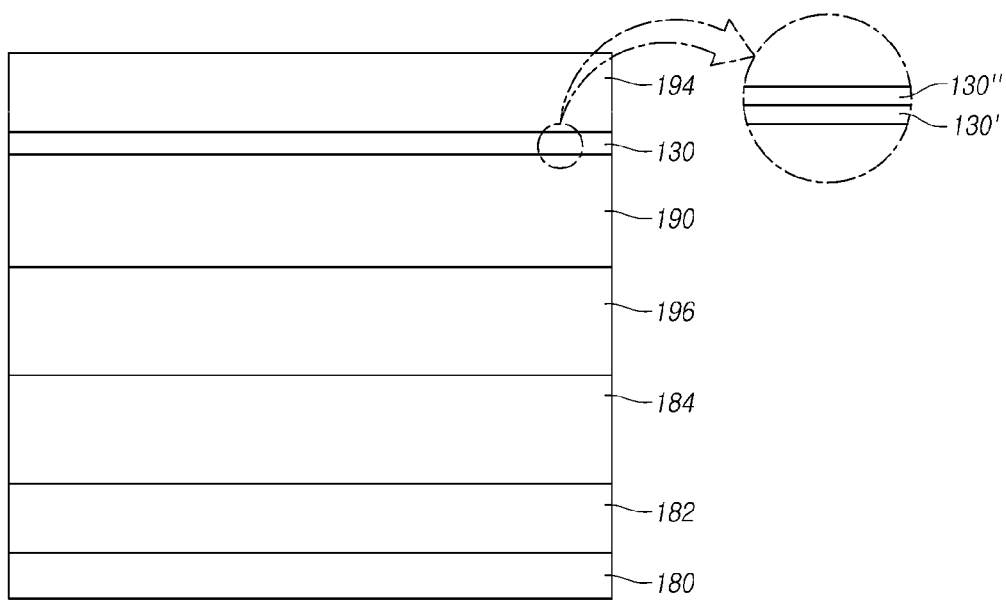
FIG. 6B is a cross-sectional view taken along line C-C' in FIG. 2A.
Figure 6C:
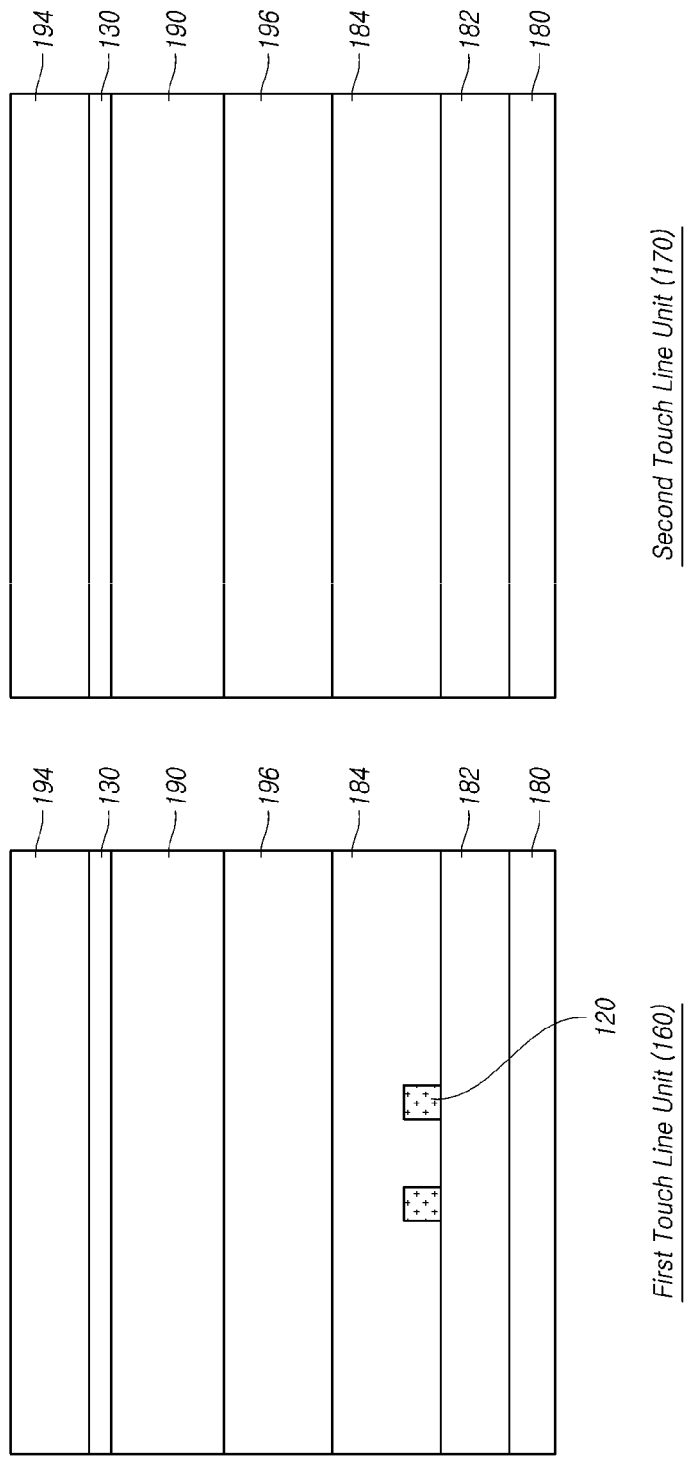
FIG. 6C is a diagram illustrating a positional relationship between the first touch lines and a positional relationship between second touch lines in a side-by-side comparison.

FIG. 6A is a cross-sectional view taken along line B-B' in FIG. 2A, FIG. 6B is a cross-sectional view taken along line C-C' in FIG. 2A, and FIG. 6C is a diagram illustrating a positional relationship between first touch lines and a positional relationship between second touch lines in comparison.

Referring to FIG. 6A, the first touch line unit 160 can be disposed on the encapsulation layer 182 disposed on the first substrate 180. The first touch line unit 160 includes a first touch electrode unit 120 disposed on the encapsulation layer 182 and a first passivation layer 184 disposed on the first touch electrode unit 120.

Referring to FIG. 6B, the second touch electrode unit 130 can be disposed on the second substrate 190 disposed on the first passivation layer 184. A second passivation layer 194 can be disposed on the second touch electrode unit 130.

Referring to FIG. 6C, a second touch line unit 170 can be located on a different layer from the first touch line unit 160. That is, since the first touch line unit 160 can be disposed on the first substrate 180 and the second touch line unit 170 can be disposed on the second substrate 190, the first touch line unit 160 and the second touch line unit 170 can be disposed on the upper and lower sides with respect to the second substrate 190.

Figure 7:
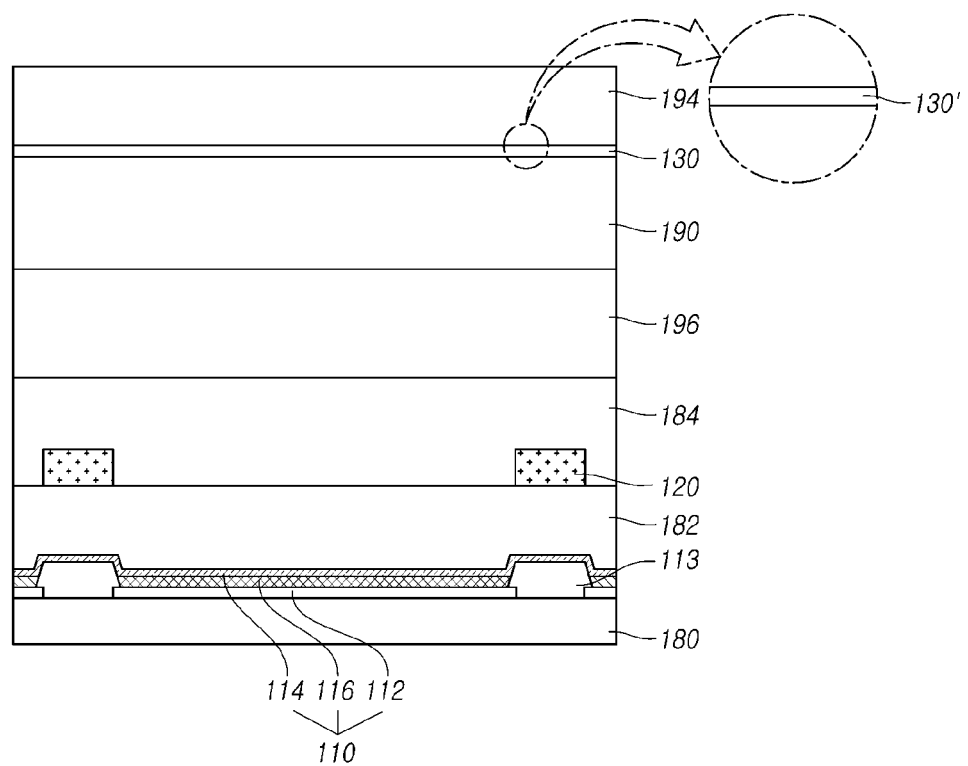
FIG. 7 is a cross-sectional view taken along line D-D' in FIG. 2A, which is an enlarged cross-sectional view.

FIG. 7 is a cross-sectional view taken along line D-D' in FIG. 2A, which is an enlarged cross-sectional view.

Referring to FIG. 2A and FIG. 7, in a pixel region, the first touch electrode unit 120 can be patterned in the form of a mesh in which the electrode metal has a plurality of open regions, and at least one sub-pixel or a light-emitting region thereof can exist in the plurality of open regions. When patterned in the form of a mesh, the first touch electrode unit 120 can overlap with a plurality of banks 113 defining sub-pixel regions.

As described above, the electrode metal of the first touch electrode unit 120 can be patterned in such a manner that, when viewed in a plane, the light-emitting region of at least one sub-pixel exists to correspond to the position of each of the open regions existing in the region of the first touch electrode unit 120, it is possible to enhance the luminous efficiency of the display panel 110.

As illustrated in FIG. 2A, each of the first touch electrodes 120a, 120b, and 120c can be formed of a metal or an alloy thereof in the form of a mesh, and the first touch lines 160a, 160b, and 160c can contain the same material as the first touch electrodes 120a, 120b, and 120c.

As illustrated in FIG. 7, the second touch electrode unit 130 can be made of an integral-type transparent metal oxide 130', and as illustrated in FIG. 6B, the second touch line unit 160 can include at least two layers, which can be made of the same material 130' as the second touch electrode unit 130 and a metal or alloy thereof 130". In other words, the second touch electrode unit 130, which can be integrally disposed in the light-emitting region of the display panel 110, can be configured as a transparent electrode 130' of, for example, a metal oxide or the like, and the second touch line unit 170 disposed in a non-light-emitting region of the display panel 110 can include at least two layers including the same metal oxide 130' and the metal or its alloy 130" as the second touch electrode unit 130 in order to lower the specific resistance thereof.

Figure 8A:
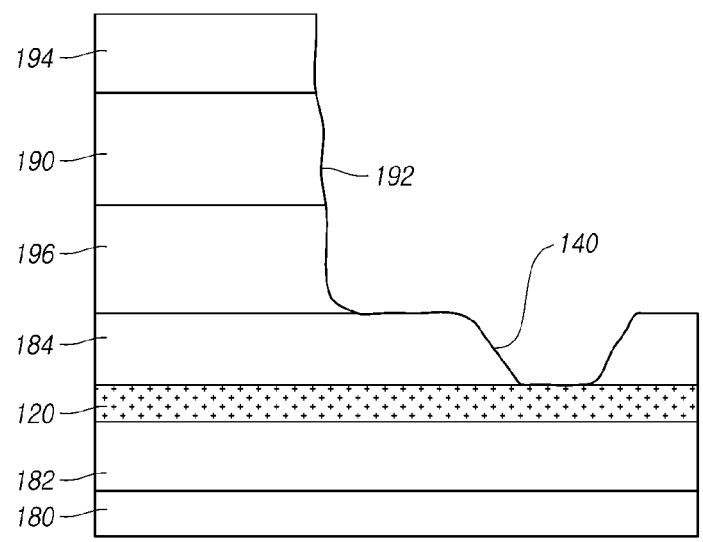
FIG. 8A is a cross-sectional view taken along line E-E' in FIG. 2A.
Figure 8B:
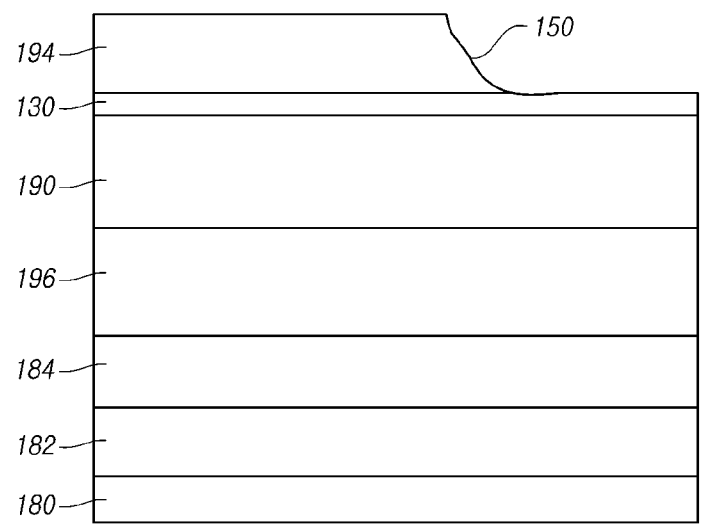
FIG. 8B is a cross-sectional view taken along line F-F' in FIG. 2A.

FIG. 8A is a cross-sectional view taken along line E-E' in FIG. 2A, FIG. 8B is a cross-sectional view taken along line F-F' in FIG. 2A, and FIG. 8C is a diagram representing positional relationship between the first touch pads and a positional relationship between the second touch pads in comparison.

Referring to FIG. 8A, the first touch pad unit 140 can be disposed on the encapsulation layer 184 disposed on the first substrate 180 and can be connected to the touch driving circuit TDC. The touch pad unit 150 can be disposed on the second substrate 190.

The first touch pad unit 140 opens the first touch line unit 160 so that the first touch line unit 160 can be connected to the touch driving circuit TDC through the first touch pad unit 140. Similarly, the second touch pad unit 150 opens the second touch line unit 170 so that the second touch line unit 170 can be connected to the touch driving circuit TDC through the second touch pad unit 150.

The first touch pad unit 140 can be disposed on the first touch line 160 and the encapsulation layer 182 disposed on the first substrate 180. A part of the first passivation layer 184 disposed on the encapsulation 182 can be opened to form the first touch pad unit 140.

The first touch pad unit 140 can be connected to the touch driving circuit TDC through the first touch pad unit groove 192 of the second substrate 190.

Referring to FIG. 8B, the second touch pad unit 150 can be disposed on the second substrate 190 disposed on the first passivation layer 184. A part of the second passivation layer 194 can be opened to form the second touch pad unit 150.

Referring to FIG. 8C, the second touch pad unit 150 can be located on a different layer from the first touch pad unit 140 and can be positioned higher than the first touch pad unit 140. That is, since the first touch line unit 160 can be disposed on the first substrate 180 and the second touch line unit 170 can be disposed on the second substrate 190, the first touch line unit 160 and the second touch line unit 170 can be disposed on the upper and lower sides with respect to the second substrate 190.

Figure 9:
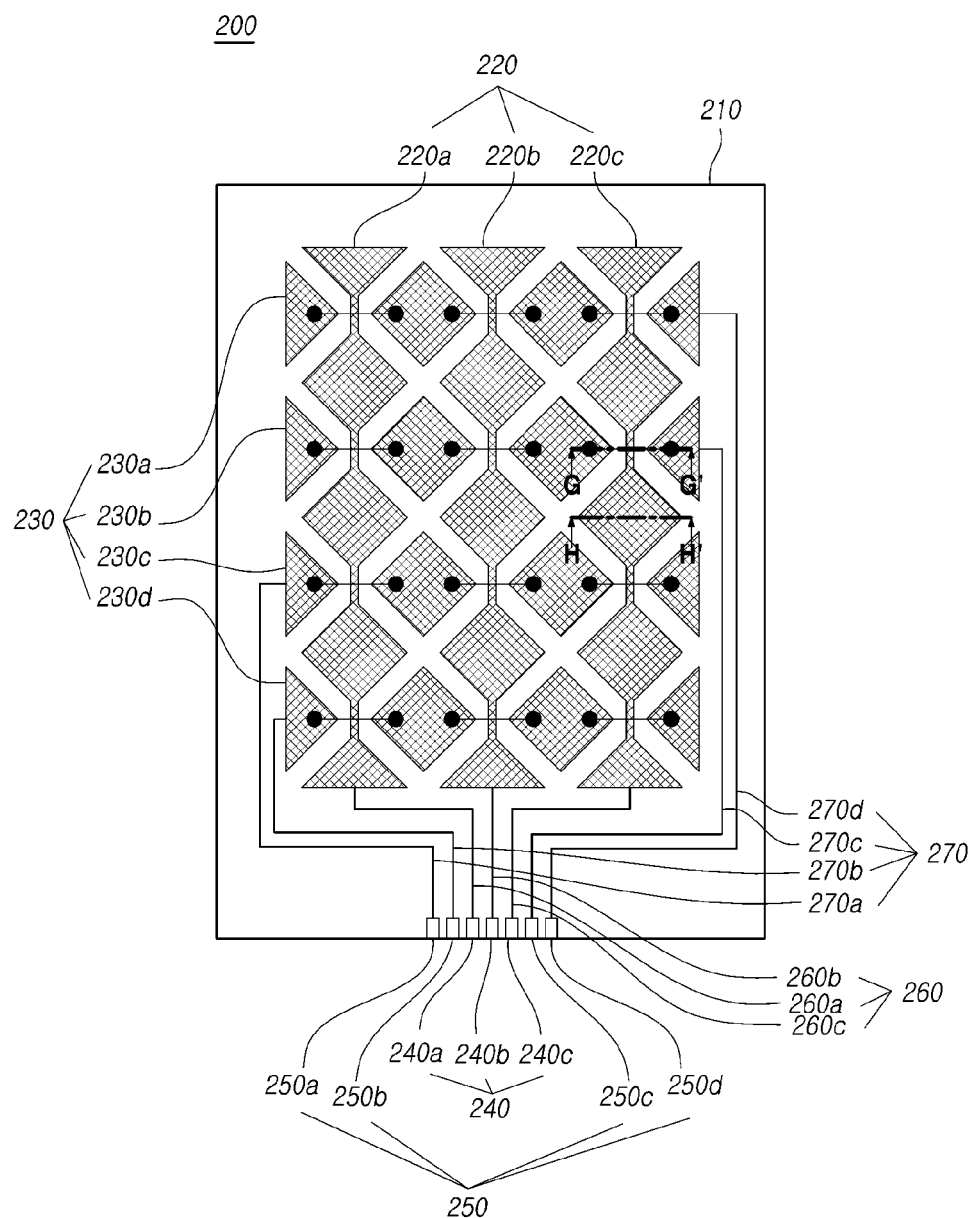
FIG. 9 is a plan view illustrating a display device according a comparative example.
Figure 10A:
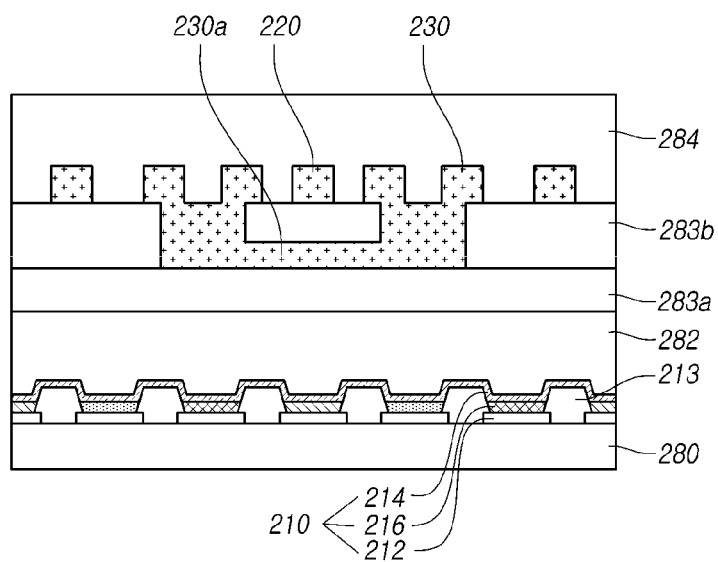
FIG. 10A is a cross-sectional view taken along line G-G' in FIG. 9.
Figure 10B:
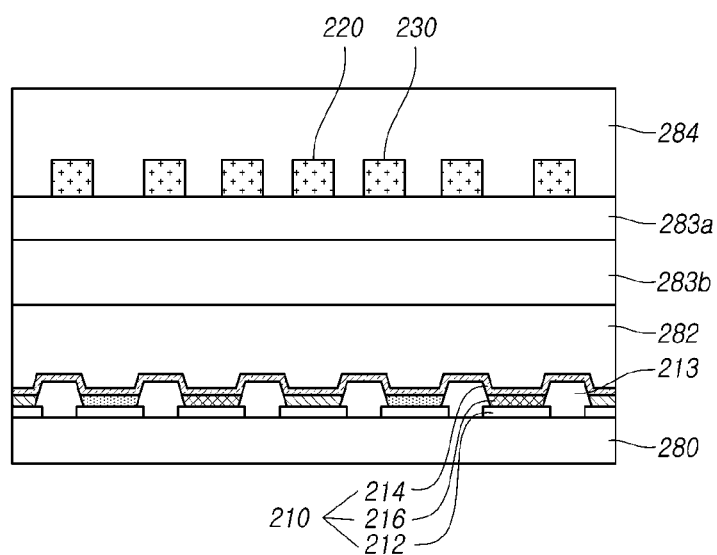
FIG. 10B is a cross-sectional view taken along line H-H' in FIG. 9.

FIG. 9 is a plan view of a display device according to a comparative example, FIG. 10A is a cross-sectional view taken along line G-G' in FIG. 9, and FIG. 10B is a cross-sectional view taken along the line H-H' in FIG. 9.

Referring to FIG. 9, the touch display device 200 according to a comparative example includes a first touch electrode unit 220, to which a touch driving signal can be applied, on a display panel 210, and a second touch electrode unit 230, which forms a capacitance with the first touch electrode unit 220 and, from which a touch sensing signal can be sensed.

A touch display device 200 according to a comparative example includes: a first touch pad unit 240 connected to the touch driving circuit TDC illustrated in FIG. 1; a second touch pad unit 250 connected to the touch driving circuit TDC; a first touch line unit 260 electrically connected to the first touch electrode unit 220 and connected to the touch driving circuit TDC through the second touch pad unit 250; and a second touch line unit 270 electrically connected to the second touch electrode unit 230 and connected to the touch driving circuit TDC through the second touch pad unit 250.

Referring to FIGS. 10A and 10B, the first touch line unit 260 and the first touch electrode unit 220 can be disposed on the same layer. The second touch line unit 270 and the second touch electrode unit 230 can be disposed on the same layer. The first touch electrode unit 220 and the second touch electrode unit 230 can be disposed on the same layer. The first touch pad unit 240 can be disposed on the same layer as the second touch pad unit 250.

The touch display device 200 according to the comparative example includes: a display panel 210 disposed on a substrate 280; an encapsulation layer 282 disposed on the display panel 210; a buffer layer 283a and a interlayer insulation layer 283b disposed on the encapsulation layer 282; a first touch electrode unit 220 and a second touch electrode unit 230 disposed on the buffer layer 283a and the interlayer insulating layer 283b; and a passivation layer 284 disposed on the first touch electrode unit 220 and the second touch electrode unit 230.

The first touch electrode unit 220 and the second touch electrode unit 230 can be disposed on the same layer as the interlayer insulating layer 283b. The first touch electrode unit 220 and the second touch electrode unit 230 can be patterned in the form of a mesh in which the electrode metal has a plurality of open regions, and at least one sub-pixel or a light-emitting region thereof can exist in the plurality of open regions. When patterned in the form of a mesh, the first touch electrode unit 220 and the second touch electrode unit 230 can overlap with a plurality of banks 213 defining sub-pixel regions. Second touch electrode units 230 can be connected by a bridge 230a disposed on the interlayer insulating layer 283b.

The display panel 210 includes a first electrode 212 disposed on the first substrate 280, a second electrode 214, and a light-emitting layer 216 located between the first electrode 212 and the second electrode 214.

Since the first touch line unit 260 and the second touch line unit 270 can be disposed in the same layer as the interlayer insulating layer 283b, some of two or more second touch lines 270a, 270b, 270c, and 270d (e.g., the second touch lines 270c and 270d) included in the second touch line unit 270 can be located on the right side of FIG. 9 and the remaining ones 270a and 270b can be located on the left side of FIG. 9.

Figure 11:
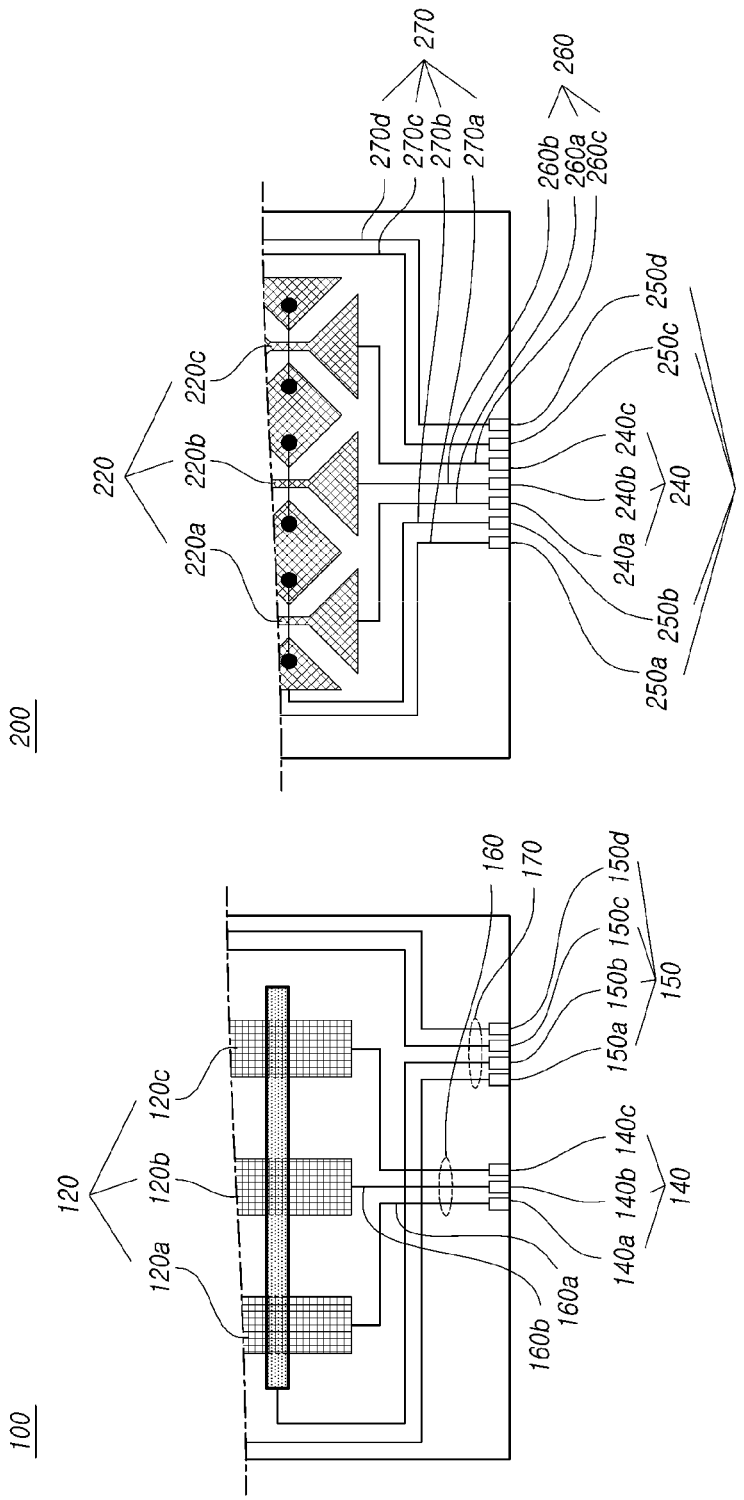
FIG. 11 is a diagram comparing the configurations of the first touch pad units and the second touch pad units of the touch display device according to the embodiment of FIG. 5 and the touch display device of the comparative example of FIGS. 10A and 10B.

FIG. 11 is a diagram comparing the configurations of the first touch pad units and the second touch pad units of the touch display device according to the embodiment of FIG. 5 and the touch display device of the comparative example of FIGS. 10A and 10B.

Referring to FIG. 11, in the touch display device 200 according to the comparative example of FIG. 9, since the first touch lines 260a, 260b, and 260c and the second touch lines 270a, 270b, 270c, and 270d can be disposed on the same layer, i.e. the interlayer insulation layer 283b, the first touch lines 260a, 260b, and 260c and the second touch lines 270a, 270b, 270c, and 270d cannot intersect with each other. Thus, the second touch pads 250c and 250d connected to some of the second touch lines 270a, 270b, 270c, and 270d (e.g., the second touch lines 270c and 270d), which can be located on the right side of FIG. 9, and the second touch pads 250a and 250b connected to the remaining ones of the second touch lines 270a, 270b, 270c, and 270d (e.g., the second touch lines 270a and 270b), which can be located on the left side of FIG. 9, cannot be gathered in one place.

On the contrary, in the touch display device 100 according to the embodiment of FIG. 5, since the first touch lines 160a, 160b, and 160c and the second touch lines 170a, 170b, 170c, and 170d can be disposed on different layers, the first touch lines 160a, 160b, and 160c and the second touch lines 170a, 170b, 170c, and 170d can intersect with each other. Thus, the second touch pads 150a and 150b connected to some of the second touch lines 170a, 170b, 170c, and 170d (e.g., the second touch lines 170c and 170d), which can be located on the left side of FIG. 5, and the second touch pads 150d and 150c connected to the remaining ones of the second touch lines 170a, 170b, 170c, and 170d (e.g., the second touch lines 170a and 170b), which can be located on the right side of FIG. 5, can be gathered in one place.

Since the first touch pads 140a, 140b, and 140c and the second touch pads 150a, 150b, 150c, and 150d can be gathered together, the first touch pad unit 140 and the second touch pad unit 150 can be easily designed. In addition, since the first touch pad unit 140 and the second touch pad unit 150 can be located on different layers, it is possible to prevent a touch sensing signal, which can be sensed through the second touch pad unit 150, from being affected by a touch driving signal applied to the first touch pad unit 140.

Figure 12:
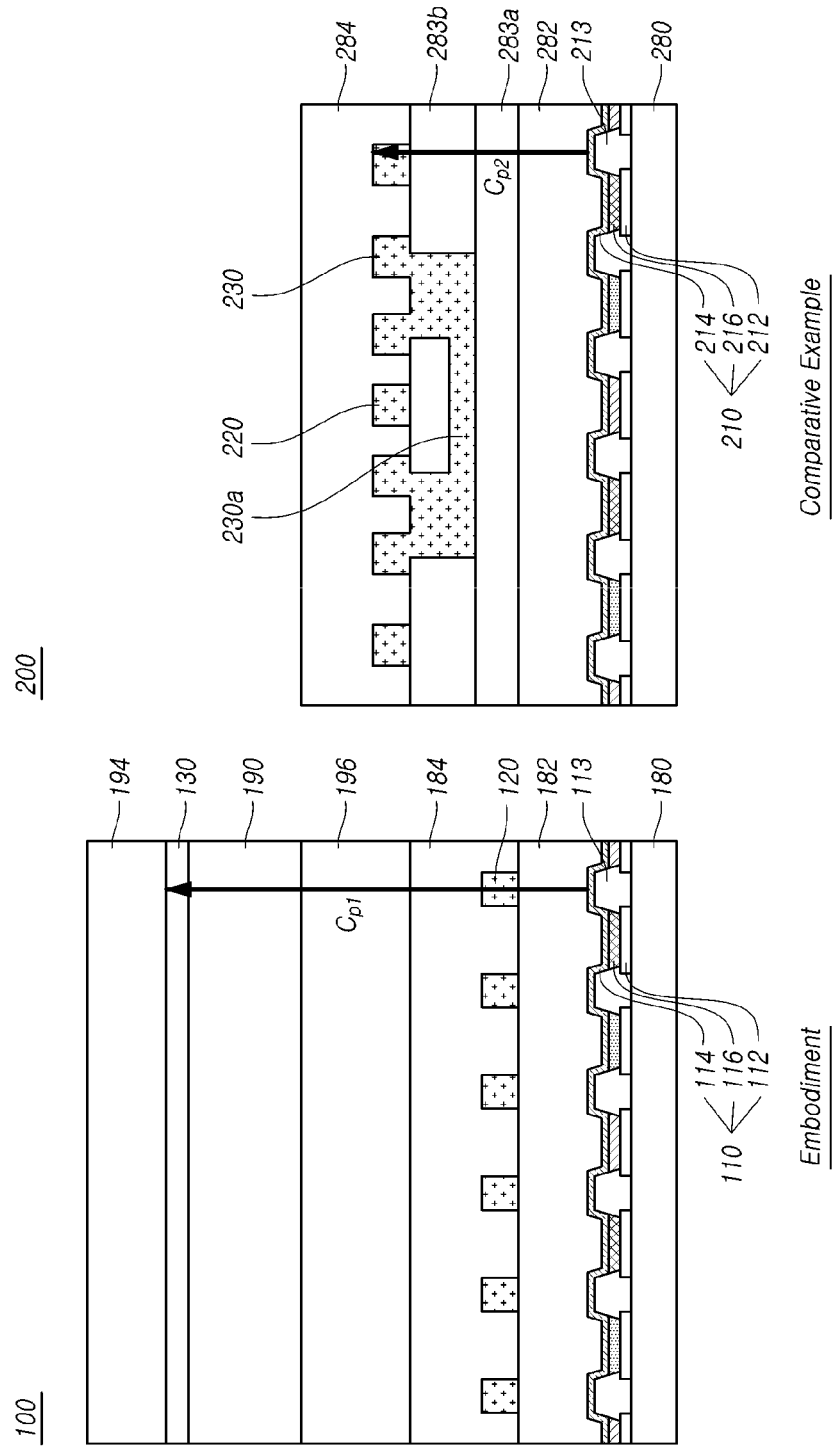
FIG. 12 is a view for explaining a difference between parasitic capacitances of the touch display device according to the embodiment of FIG. 5 and the touch display device according to the comparative example of FIGS. 10A and 10B.

FIG. 12 is a view for explaining a difference between parasitic capacitances of the touch display device according to the embodiment of FIG. 5 and the touch display device according to the comparative example of FIGS. 10A and 10B.

Referring to FIG. 12, the touch display device 200 according to the comparative example of FIGS. 10A and 10B includes an encapsulation layer 282, a buffer layer 283a, and an insulating layer 283b located between the display panel 210 and the second touch electrode unit 230. Whereas, the touch display device 100 according to the embodiment of FIG. 5 includes an encapsulation layer 182, a first passivation layer 184, an adhesive layer 196, and a second substrate 190 located between the display panel 110 and the second touch electrode unit 130.

Therefore, the parasitic capacitance of the display panel 110 and the second touch electrode unit 130 in the touch display device 100 according to the embodiment of FIG. 5 can be smaller than the parasitic capacitance of the display panel 210 and the second touch electrode unit 230 in the touch display device 200 according to the comparative example of FIG. 9. Specifically, the parasitic capacitance CP1 of the second electrode 114 and the second touch electrode unit 130 of the display panel 110 in the touch display device 100 according to the embodiment of FIG. 5 can be smaller than the parasitic capacitance CP2 of the second electrode 214 and the second touch electrode unit 230 of the display panel 210 in the touch display device 200 according to the comparative example of FIG. 9.

The touch display device 100 according to the embodiment of FIG. 5 reduces the parasitic capacitance CP1 by sufficiently reducing the distance between the display panel 110 and the second touch electrode unit 130, thereby improving the touch performance. In particular, the touch display device 100 according to the embodiment of FIG. 5 can maintain the touch performance in the touch panel 110 having a large area.

FIGS. 13A to 13F are process diagrams of a method of manufacturing a touch display device according to another embodiment.

Referring to FIGS. 13A to 13F, a method of manufacturing a touch display device according to another embodiment includes: forming a display panel including first and second electrodes disposed on a first substrate and a light-emitting layer located between the first electrode and the second electrode; forming an encapsulation layer on the second electrode of the display panel; forming a first touch electrode unit extending in one of a first direction and a second direction intersecting with the first direction on the encapsulation layer; forming a first passivation layer on the first touch electrode unit; forming a second touch electrode unit extending on the second substrate in a remaining one of the first direction and the second direction; and bonding the first passivation layer and the second substrate to each other by an adhesive layer.

Figure 13A:
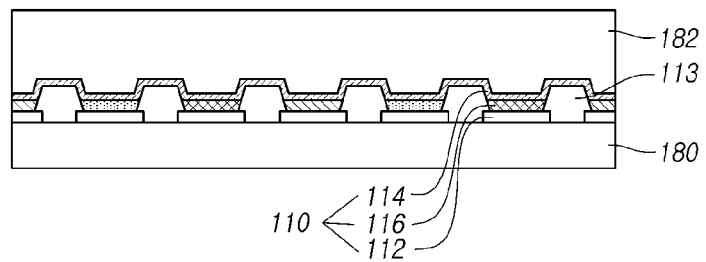
FIGS. 13A to 13F are process diagrams of a method of manufacturing a touch display device according to another embodiment.

Referring to FIG. 13A, in the manufacturing method of the touch display device 100 according to another embodiment, a display panel, which includes first and second electrodes 112 and 114 disposed on a first substrate 180 and a light-emitting layer 116 located between the first electrode 112 and the second electrode 114, can be formed. In addition, an encapsulation layer 182 can be formed on the second electrode 114 of the display panel 110.

Figure 13B:
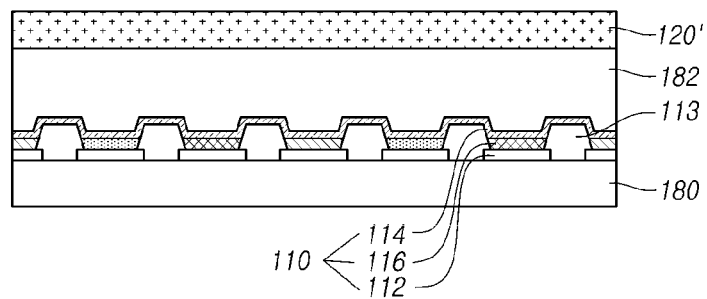

Referring to FIG. 13B, a material used to form the first touch electrode unit 120 on the encapsulation layer 182, for example, an electrode metal 120', can be formed on the entire surface.

Figure 13C:
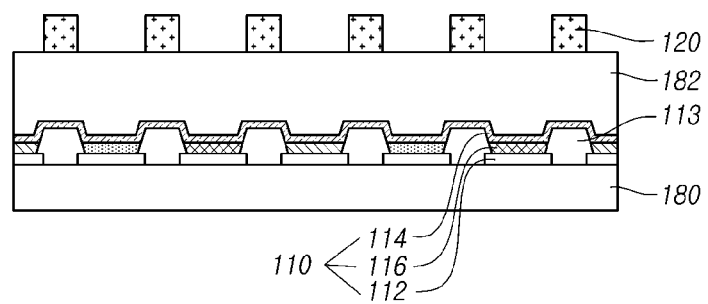

Referring to FIG. 13C, the metal electrode 120' can be patterned in the form of a mesh having a plurality of open regions, thereby forming a first touch electrode unit 120 extending in one of a first direction and a second direction intersecting with the first direction. When patterned in the form of a mesh, the first touch electrode unit 120 can overlap with a plurality of banks 113 defining sub-pixel regions.

Figure 13D:
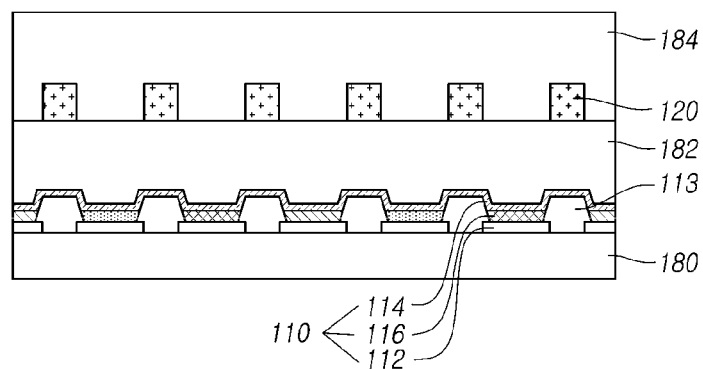

Referring to FIG. 13D, a first passivation layer 184 can be formed on the first touch electrode unit 120.

Figure 13E:
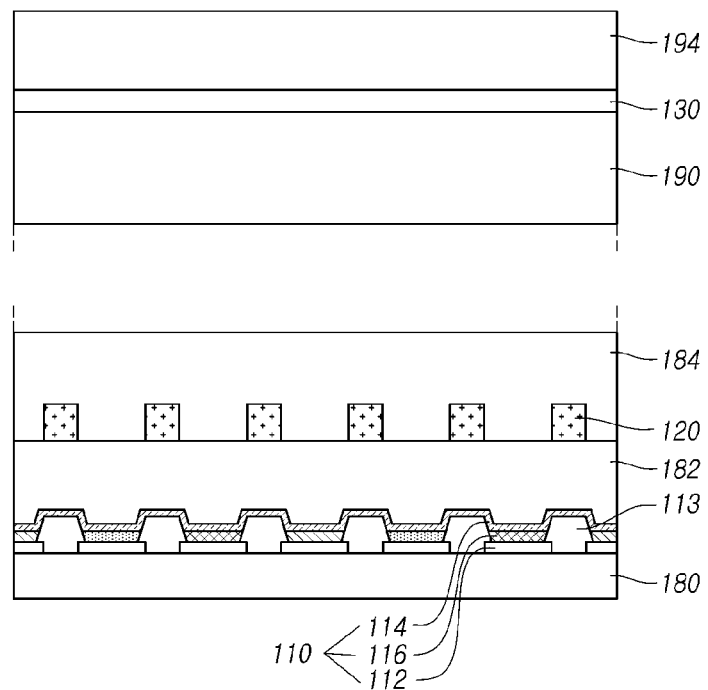

Referring to FIG. 13E, a second touch electrode unit 130 can be formed on the second substrate 190 to extend in another one of the first direction and the second direction.

Figure 13F:
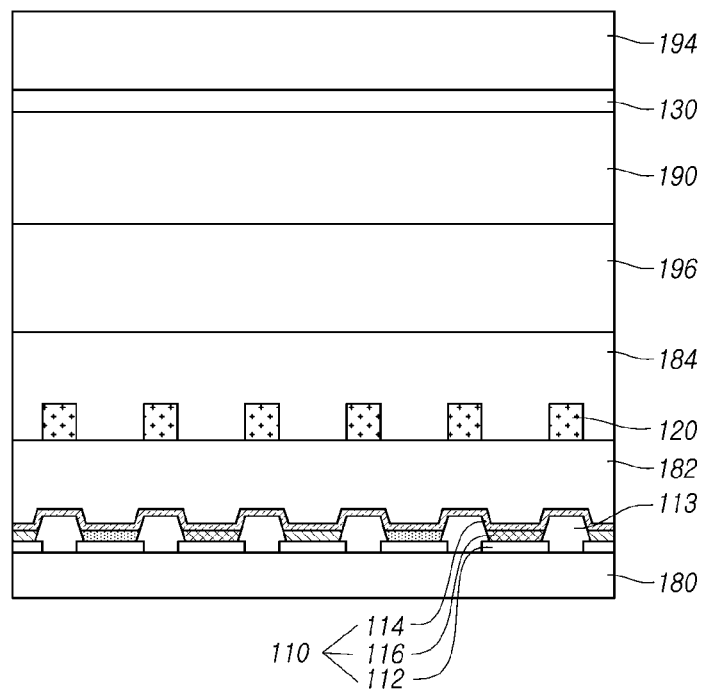

Referring to FIG. 13F, the first passivation layer 184 formed on the first substrate 180 and the second substrate 190 can be bonded to each other with the adhesive layer 196, thereby completing the touch display device 100.

As described above, the first substrate 180 can be a plastic substrate and the second substrate 190 can be a film. The second substrate 190 can have a first touch pad unit groove 192 at a position corresponding to the first touch pad unit.

As illustrated in FIG. 13C, when forming the first touch electrode unit 120, a first touch pad unit 140 connected to the touch driving circuit TDC and a first touch line unit 160 electrically connected to the touch panel 120 and connected to the touch driving circuit TDC through the first touch pad unit 140 can be formed on the encapsulation layer 182.

As illustrated in FIG. 13E, when the second touch electrode unit 130 can be formed, the first touch pad unit 140 on the second substrate, the second touch pad unit 150 located on the same side surface as one of the first direction and the second direction in the first substrate 180, and connected to the touch driving circuit TDC, and the second touch line unit 170 electrically connected to the second touch electrode unit 130 and connected to touch driving circuit TDC through the second touch pad unit 150 can be formed.

The second touch line unit 170 can be located on a different layer from the first touch line unit 160 and the second touch line unit 170 and the first touch line unit 160 can be arranged above and below with respect to the second substrate 190 to intersect with each other, and the second touch pad unit 150 can be disposed on a different layer from the first touch pad unit 140 and can be located higher than the first touch pad unit 140.

As described with reference to FIGS. 2A and 2B, the first touch electrode unit 120 includes two or more first touch electrodes, and the second touch electrode unit 130 includes two or more second touch electrodes. The first touch line unit 160 includes two or more first touch lines, which can be connected to two or more first touch electrodes, respectively, and the second touch line unit 170 includes two or more second touch lines, which can be connected to two or more second touch electrodes, respectively. The first touch pad unit 140 includes two or more first touch pads, which can be connected to two or more first touch lines, respectively, and the second touch pad unit 150 includes two or more second touch pads, which can be connected to two or more second touch lines, respectively.

Some of the second touch lines can be connected to some of the second touch pads through one of the opposite side surfaces of the first substrate in the second direction, and the remaining ones of the second touch lines can be connected to the remaining ones of the second touch pads through the remaining one of the opposite side surfaces of the first substrate in the second direction. Some of the first touch lines can be connected to some of the first touch pads through one of the opposite side surfaces of the first substrate in the first direction, and the remaining ones of the first touch lines can be connected to the remaining ones of the first touch pads through the remaining one of the opposite side surfaces of the first substrate in the first direction.

The first touch pads and the second touch pads can be gathered together. The second substrate 190 can have a first touch pad unit groove 192 disposed at a position corresponding to the first touch pad unit 140.

Referring to FIGS. 3B and 4B, when the second substrate 190 can be used as a film, a touch electrode film 190 according to another embodiment can include: a second substrate 190 attached, by an adhesive layer 196, to a first substrate 180 having the display panel 110 described with reference FIGS. 3A and 4A, an encapsulation layer disposed on the display panel 110, a first electrode unit 120 disposed on the encapsulation layer and extending in one of a first direction and a second direction intersecting with the first direction; a second touch electrode unit 130 disposed on the second substrate 190 and extending in the other of the first direction and the second direction; a second touch pad unit 150 disposed on the second substrate 190 and located on the same side surface of the first substrate 180 as the first touch pad unit 140 in one of the first direction and the second direction and connected to the touch driving circuit TDC; and a second touch line unit 170 disposed on the second substrate 190 and electrically connected to the second touch electrode unit 130 and connected to the touch driving circuit TDC through the second touch pad unit 150.

The above-mentioned touch electrode film sufficiently reduces the distance between a display panel and a touch electrode in a touch display device, thereby reducing a parasitic capacitance, so that the touch electrode film can be used for improving touch performance. In the touch display device using the touch electrode film, touch performance can be improved in a large-area touch panel.

According to the embodiments described above, it is possible to provide a touch display device, a method of manufacturing the touch display device, and a film of the touch display device in which touch performance can be improved by reducing a parasitic capacitance by sufficiently reducing a distance between a display panel and a touch electrode.

According to the embodiments, it is to provide a touch display device, a method of manufacturing the touch display device, and a film of the display device in which touch performance can be improved even in a large-area touch panel.

The above description and the accompanying drawings provide an example of the technical idea of the present disclosure for illustrative purposes only. Those having ordinary knowledge in the technical field, to which the present disclosure pertains, will appreciate that various modifications and changes in form, such as combination, separation, substitution, and change of a configuration, are possible without departing from the essential features of the present disclosure. Therefore, the embodiments disclosed in the present disclosure are intended to illustrate the scope of the technical idea of the present disclosure, and the scope of the present disclosure is not limited by the embodiment. The scope of the present disclosure shall be construed on the basis of the accompanying claims in such a manner that all of the technical ideas included within the scope equivalent to the claims belong to the present disclosure.

What is claimed is:

1. A touch display device comprising:
 a first substrate;
 a display panel comprising a first electrode and a second electrode disposed on the first substrate, and a light-emitting layer located between the first electrode and the second electrode;
 an encapsulation layer disposed on the second electrode of the display panel;
 a first touch electrode unit disposed on the encapsulation layer and extending in one of a first direction and a second direction intersecting with the first direction;
 a first passivation layer disposed on the first touch electrode unit;
 a second substrate disposed on the first passivation layer; and
 a second touch electrode unit disposed on the second substrate and extending in a remaining one of the first direction and the second direction
 wherein the first substrate is a plastic substrate and the second substrate is a film, wherein an adhesive layer is located between the first passivation layer and the second substrate,
 wherein the first passivation layer and the second substrate are directly bonded to each other by the adhesive layer, and
 wherein the encapsulation layer includes at least one organic layer and at least one inorganic layer that are alternately laminated.

2. The touch display device of claim 1,
 wherein the touch display device further comprises a second passivation layer on the second touch electrode unit.

3. The touch display device of claim 1, further comprising:
 a first touch pad unit disposed on the encapsulation layer and connected to a touch driving circuit;
 a second touch pad unit disposed on the second substrate and located on the same side surface as the first touch pad unit in the first substrate in one of the first direction and the second direction and connected to the touch driving circuit;
 a first touch line unit disposed on the encapsulation layer, electrically connected to the first touch electrode unit, and connected to the touch driving circuit through the first touch pad unit; and
 a second touch line unit disposed on the second substrate, electrically connected to the second touch electrode unit, and connected to the touch driving circuit through the second touch pad unit.

4. The touch display device of claim 3, wherein the second touch line unit is located on a different layer from the first touch line unit,
 wherein the second touch line unit and the first touch line unit intersect with each other, and are disposed above and below with respect to the second substrate, and
 wherein the second touch pad unit is located on a different layer from the first touch pad unit and is located higher than the first touch pad unit.

5. The touch display device of claim 3, wherein the first touch electrode unit comprise two or more first touch electrodes, and the second touch electrode unit comprises two or more second touch electrodes,
 wherein the first touch line unit comprises two or more first touch lines, which are connected to the two or more first touch electrodes, respectively, and the second touch line unit comprises two or more second touch lines, which are connected to the two or more second touch electrodes, respectively,
 wherein the first touch pad unit comprises two or more first touch pads, which are connected to the two or more first touch lines, respectively, and the second touch pad unit comprises two or more second touch pads, which are connected to the two or more second touch lines, respectively,
 wherein some of the first touch lines are connected to some of the first touch pads through one of the opposite side surfaces of the first substrate in the first direction, and remaining ones of the first touch lines are connected to remaining ones of the first touch pads through a remaining one of the opposite side surfaces of the first substrate in the first direction, or some of the second touch lines are connected to some of the second touch pads through one of the opposite side surfaces of the first substrate in the second direction, and remaining ones of the second touch lines are connected to remaining ones of the second touch pads through a remaining one of the opposite side surfaces of the first substrate in the second direction, and
 wherein the first touch pads and the second touch pads are respectively grouped together.

6. The touch display device of claim 3, wherein each of the first touch electrodes is made of a metal or an alloy thereof in a form of a mesh, and the first touch lines contain a same material as each of the first touch electrodes, and
 wherein the second touch electrodes are made of an integral-type transparent metal oxide, and the second touch lines are made of a same material as the second touch electrodes and a metal or an alloy thereof in at least two layers.

7. The touch display device of claim 6, wherein the second substrate has a first touch pad unit groove at a position corresponding to the first touch pad unit.

8. The touch display device of claim 1, wherein the first touch electrode unit is a touch driving electrode configured to apply a touch driving signal, and the second touch electrode unit is a touch sensing electrode configured to sense a touch.

9. The touch display device of claim 1, wherein the first passivation layer and the second substrate are interposed between the first touch electrode unit and the second touch electrode unit.

10. A touch electrode film comprising:
a first substrate having a display panel;
a second substrate coupled to the first substrate;
an encapsulation layer disposed on the display panel;
a first touch electrode unit disposed on the encapsulation layer and extending in one of a first direction and a second direction intersecting with the first direction;
a second touch electrode unit disposed on the second substrate and extending in a remaining one of the first direction and the second direction;
a first touch pad unit disposed on the encapsulation layer and connected to a touch driving circuit;
a second touch pad unit disposed on the second substrate and located on the same side surface as the first touch pad unit in the first substrate in one of the first direction and the second direction and connected to the touch driving circuit; and
a second touch line unit disposed on the second substrate, electrically connected to the second touch electrode unit, and connected to the touch driving circuit through the second touch pad unit,
wherein the first substrate is a plastic substrate and the second substrate is a film, wherein an adhesive layer is located between a first passivation layer and the second substrate,
wherein the first passivation layer and the second substrate are directly bonded to each other by the adhesive layer, and
wherein the encapsulation layer includes at least one organic layer and at least one inorganic layer that are alternately laminated.

11. The touch electrode film of claim 10, wherein the second touch electrodes are made of an integral-type transparent metal oxide, and the second touch lines are made of a same material as the second touch electrodes and a metal or an alloy thereof in at least two layers.

12. The touch electrode film of claim 10, wherein the second substrate has a first touch pad unit groove at a position corresponding to the first touch pad unit.

13. The touch electrode film of claim 10, wherein the second touch electrode unit is a touch sensing electrode configured to sense a touch.

14. A method of manufacturing a touch display device, the method comprising:
forming a display panel comprising first and second electrodes disposed on a first substrate and a light-emitting layer located between the first electrode and the second electrode; forming an encapsulation layer on the second electrode of the display panel; forming a first touch electrode unit extending in one of a first direction and a second direction intersecting with the first direction on the encapsulation layer; forming a first passivation layer on the first touch electrode unit;
forming a second touch electrode unit extending on a second substrate in a remaining one of the first direction and the second direction; and
bonding the first passivation layer and the second substrate directly to each other by an adhesive layer,
wherein the first substrate is a plastic substrate and the second substrate is a film,
wherein the adhesive layer is located between the first passivation layer and the second substrate, and
wherein the encapsulation layer includes at least one organic layer and at least one inorganic layer that are alternately laminated.

15. The method of claim 14, wherein the forming of the first touch electrode unit comprises forming, on the encapsulation unit, a first touch pad unit connected to the touch driving circuit and a first touch line unit electrically connected to the first touch electrode unit and connected to the touch driving circuit through the first touch pad unit, and
wherein the forming of the second touch electrode unit comprises forming, on the second substrate, a second touch pad unit located on a same surface as the first touch pad unit in the first substrate in one of the first direction and the second direction and connected to the touch driving circuit, and a second touch line unit electrically connected to the second touch electrode and connected to the touch driving circuit through the second touch pad unit.

16. The method of claim 15, wherein the second touch line unit is located on a different layer from the first touch line unit, the second touch line unit and the first touch line unit intersect with each other and are disposed above and below with respect to the second substrate, and
wherein the second touch pad unit is located on a different layer from the first touch pad unit and is located higher than the first touch pad unit.

17. The method of claim 15, wherein the first touch electrode unit comprises two or more first touch electrodes, and the second touch electrode unit comprises two or more second touch electrodes,
wherein the first touch line unit comprises two or more first touch lines, which are connected to the two or more first touch electrodes, respectively, and the second touch line unit comprises two or more second touch lines, which are connected to the two or more second touch electrodes, respectively,
wherein the first touch pad unit comprises two or more first touch pads, which are connected to the two or more first touch lines, respectively, and the second touch pad unit comprises two or more second touch pads, which are connected to the two or more second touch lines, respectively,
wherein some of the first touch lines are connected to some of the first touch pads through one of the opposite side surfaces of the first substrate in the first direction, and remaining ones of the first touch lines are connected to remaining ones of the first touch pads through a remaining one of the opposite side surfaces of the first substrate in the first direction, or some of the second touch lines are connected to some of the second touch pads through one of the opposite side surfaces of the first substrate in the second direction, and remaining ones of the second touch lines are connected to remaining ones of the second touch pads through a remaining one of the opposite side surfaces of the first substrate in the second direction, and
wherein the first touch pads and the second touch pads are respectively grouped together.

18. The method of claim 15, wherein the first touch electrodes are made of a metal or an alloy thereof in a form of a mesh, the first touch lines contain a same material as each of the first touch electrodes, and
wherein the second touch electrodes are made of an integral-type transparent metal oxide, and the second touch lines are made of a same material as the second touch electrodes and a metal or an alloy thereof in at least two layers.

19. The method of claim 18, wherein the second substrate has a first touch pad unit groove at a position corresponding to the first touch pad unit.

\* \* \* \* \*